US012813359B2

(12) United States Patent
Wu et al.

(10) Patent No.: US 12,813,359 B2
(45) Date of Patent: Nov. 24, 2026

(54) SYSTEM ON INTEGRATED CIRCUIT STRUCTURE

(71) Applicant: Taiwan Semiconductor Manufacturing Company, Ltd., Hsinchu (TW)

(72) Inventors: Chih-Wei Wu, Yilan County (TW); Ying-Ching Shih, Hsinchu City (TW)

(73) Assignee: Taiwan Semiconductor Manufacturing Comany, Ltd., Hsinchu (TW)

( * ) Notice: Subject to any disclaimer, the term of this patent is extended or adjusted under 35 U.S.C. 154(b) by 411 days.

(21) Appl. No.: 18/531,706

(22) Filed: Dec. 7, 2023

(65) Prior Publication Data

US 2025/0192100 A1 Jun. 12, 2025

(51) Int. Cl.

| | |
|---|---|
| ***H10W 90/15*** | (2026.01) |
| ***H10W 74/10*** | (2026.01) |
| ***H10W 80/00*** | (2026.01) |
| ***H10W 90/00*** | (2026.01) |

(52) U.S. Cl.
CPC ....... *H10W 90/155* (2026.01); *H10W 74/141* (2026.01); *H10W 74/142* (2026.01); *H10W 80/312* (2026.01); *H10W 90/00* (2026.01)

(58) Field of Classification Search
CPC . H10W 90/155; H10W 90/00; H10W 74/141; H10W 74/142
See application file for complete search history.

(56) References Cited

U.S. PATENT DOCUMENTS

| | | | | |
|---|---|---|---|---|
| 9,000,584 | B2 | 4/2015 | Lin et al. | |
| 9,048,222 | B2 | 6/2015 | Hung et al. | |
| 9,048,233 | B2 | 6/2015 | Wu et al. | |
| 9,064,879 | B2 | 6/2015 | Hung et al. | |
| 9,111,949 | B2 | 8/2015 | Yu et al. | |
| 9,263,511 | B2 | 2/2016 | Yu et al. | |
| 9,281,254 | B2 | 3/2016 | Yu et al. | |
| 9,368,460 | B2 | 6/2016 | Yu et al. | |
| 9,372,206 | B2 | 6/2016 | Wu et al. | |
| 9,496,189 | B2 | 11/2016 | Yu et al. | |
| 2015/0093858 | A1* | 4/2015 | Hwang .................. | H10P 54/00 438/113 |
| 2018/0082987 | A1* | 3/2018 | Chen ..................... | H10W 90/00 |

(Continued)

FOREIGN PATENT DOCUMENTS

| | | |
|---|---|---|
| TW | 202021073 | 6/2020 |
| TW | 202040777 | 11/2020 |

(Continued)

OTHER PUBLICATIONS

"Office Action of Taiwan Counterpart Application", issued on Jan. 9, 2025, p. 1-p. 4.

*Primary Examiner* — Peter M Albrecht
(74) *Attorney, Agent, or Firm* — JCIPRNET

(57) ABSTRACT

An SoIC structure including a first semiconductor die, second semiconductor dies, dummy dies, and a gap filling layer is provided. The second semiconductor dies are disposed over and electrically connected to the first semiconductor die. The dummy dies are disposed over the first semiconductor die to laterally surround the second semiconductor dies. The gap filling layer is disposed on the first semiconductor die to laterally encapsulate the dummy dies and the second semiconductor dies.

20 Claims, 25 Drawing Sheets

(56) References Cited

U.S. PATENT DOCUMENTS

| | | | | |
|---|---|---|---|---|
| 2018/0138101 | A1* | 5/2018 | Yu | H10W 90/00 |
| 2020/0365525 | A1* | 11/2020 | Wu | H10W 90/00 |
| 2021/0375827 | A1 | 12/2021 | Chen et al. | |
| 2022/0102242 | A1* | 3/2022 | Modi | H10W 90/00 |
| 2022/0285297 | A1 | 9/2022 | Hsu et al. | |
| 2022/0344305 | A1 | 10/2022 | Huang et al. | |
| 2023/0307418 | A1 | 9/2023 | Chang | |

FOREIGN PATENT DOCUMENTS

| | | |
|---|---|---|
| TW | 202145466 | 12/2021 |
| TW | 202213689 | 4/2022 |
| TW | 202331992 | 8/2023 |
| TW | 202335114 | 9/2023 |

* cited by examiner

SYSTEM ON INTEGRATED CIRCUIT STRUCTURE

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density as well as reliability of various electronic components (e.g., transistors, diodes, resistors, capacitors, etc.) by continual reductions in minimum feature size, which allow more components to be integrated into a given area. These smaller electronic components such as integrated circuit dies may also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
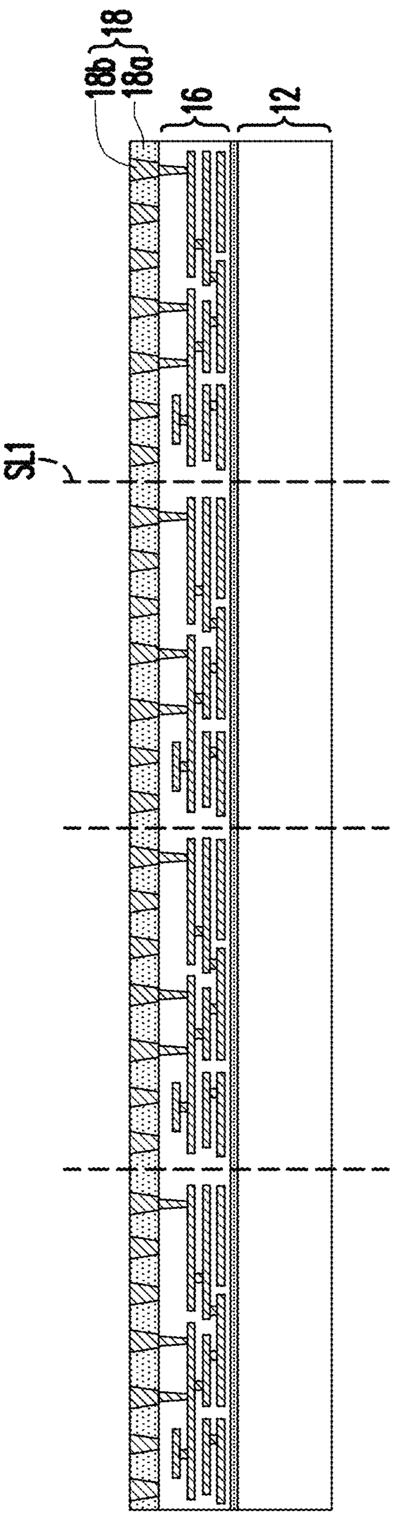
FIGS. 1A through 1J are cross-sectional views schematically illustrating a process flow for fabricating System on Integrated Circuit (SoIC) structures in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Packages and the methods of forming the same are provided in accordance with various exemplary embodiments. The intermediate stages of forming the packages are illustrated. The variations of the embodiments are discussed. Throughout the various views and illustrative embodiments, like reference numbers are used to designate like elements.

FIGS. 1A through 1J are cross-sectional views schematically illustrating a process flow for fabricating SoIC structures in accordance with some embodiments of the present disclosure.

Referring to FIG. 1A, a semiconductor wafer 10 including semiconductor dies is provided. The semiconductor dies may be logic dies, System-on-Chip (SoC) dies or other suitable semiconductor dies. The semiconductor wafer 10 may include a substrate 12 (e.g., a semiconductor substrate), an interconnect structure 16 disposed on the substrate 12, and a bonding structure 18 disposed on the interconnect structure 16. The substrate 12 of the semiconductor wafer 10 may include a crystalline silicon substrate. The substrate 12 may include various doped regions depending on design requirements (e.g., p-type substrate or n-type substrate). In some embodiments, the doped regions may be doped with p-type or n-type dopants. The doped regions may be doped with p-type dopants, such as boron or $BF_2$; n-type dopants, such as phosphorus or arsenic; and/or combinations thereof. The doped regions may be configured for n-type Fin-type Field Effect Transistors (FinFETs) and/or p-type FinFETs. In some alternative embodiments, the substrate 12 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

The interconnect structure 16 may include one or more dielectric layers (for example, one or more interlayered dielectric (ILD) layers, intermetal dielectric (IMD) layers, or the like) and interconnect wirings embedded in the one or more dielectric layers, and the interconnect wirings are electrically connected to the semiconductor devices (e.g., FinFETs) formed in the substrate 12. The material of the one or more dielectric layers may include silicon oxide ($SiO_x$, where x>0), silicon nitride ($SiN_x$, where x>0), silicon oxynitride ($SiO_xN_y$, where x>0 and y>0) or other suitable dielectric material. The interconnect wirings may include metallic wirings. For example, the interconnect wirings include copper wirings, copper pads, aluminum pads or combinations thereof.

The bonding structure 18 may include a bonding dielectric layer 18*a* and bonding conductors 18*b* embedded in the bonding dielectric layer 18*a*. The material of the bonding dielectric layer 18*a* may be silicon oxide ($SiO_x$, where x>0), silicon nitride ($SiN_x$, where x>0), silicon oxynitride ($SiO_xN_y$, where x>0 and y>0) or other suitable dielectric material, and the bonding conductors 18*b* may be conductive vias (e.g., copper vias), conductive pads (e.g., copper pads) or combinations thereof. The bonding structure 18 may be formed by depositing a dielectric material through a chemical vapor deposition (CVD) process (e.g., a plasma enhanced CVD process or other suitable process); patterning the dielectric material to form the bonding dielectric layer 18*a* including openings or through holes; and filling conductive material in the openings or through holes defined in the bonding dielectric layer 18*a* to form the bonding conductors 18*b* embedded in the bonding dielectric layer 18*a*.

Figure 1B:
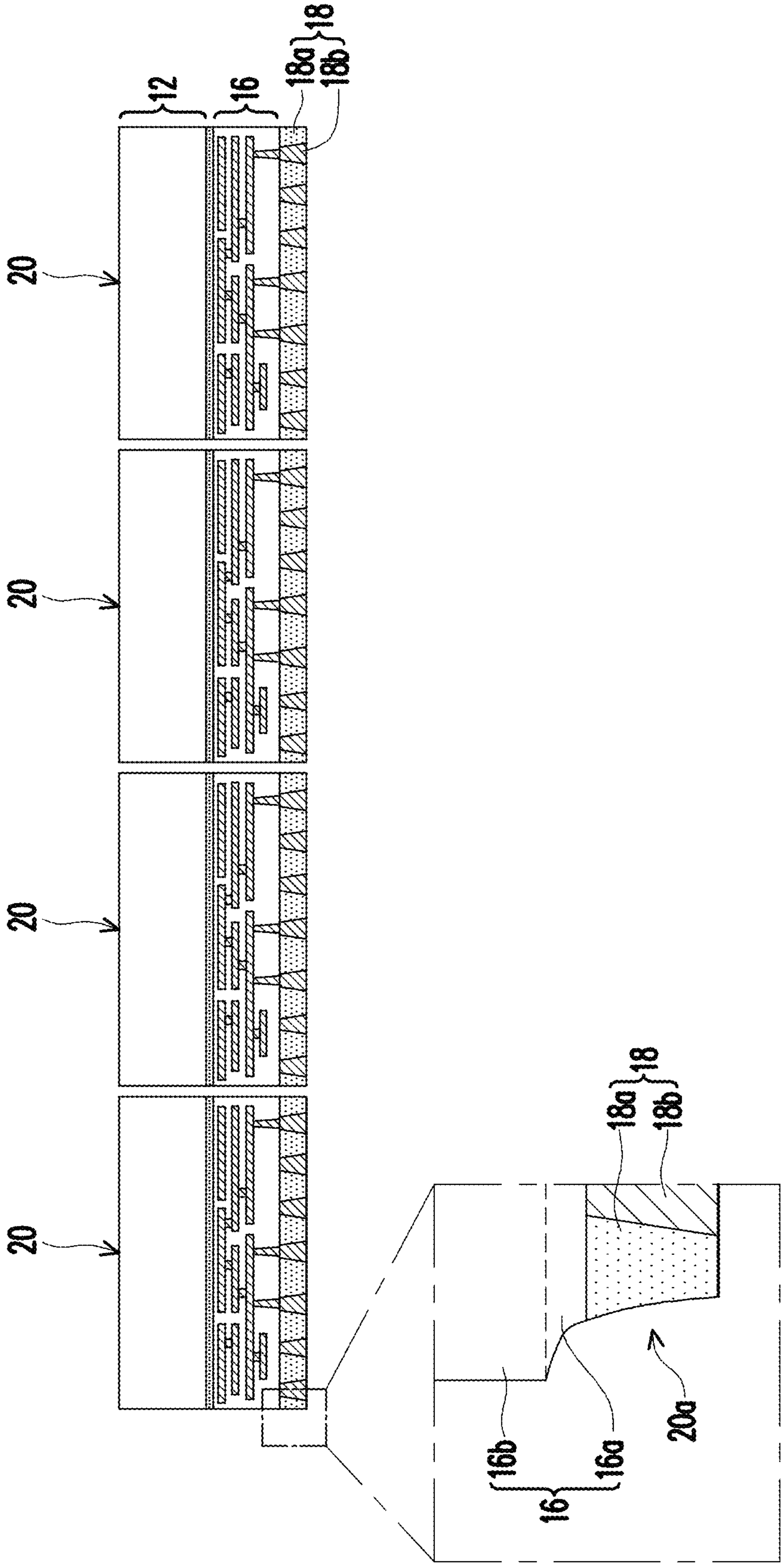

Referring to FIG. 1A and FIG. 1B, the semiconductor wafer 10 is singulated by a wafer sawing process performed along scribe lines SL1 such that singulated semiconductor dies 20 are obtained. Each of the singulated semiconductor dies 20 may include a substrate 12, an interconnect structure 16 disposed on the substrate 12, and a bonding structure 18 disposed on the interconnect structure 16. In some embodiments, the semiconductor wafer 10 is singulated by a pre-cut process followed by a wafer sawing process performed along scribe lines SL1 such that singulated semiconductor dies 20 are obtained. The pre-cut process may be a plasma dicing process, a laser drilling process or the like. Due to the pre-cut process, the width of the bonding dielectric layer 18*a* may be narrower than the width of the substrate 12. In some embodiments, the interconnect structure 16 includes a narrower portion 16*a* and a wider portion 16*b*, wherein the narrower portion 16*a* is resulted from the pre-cut process, the narrower portion 16*a* is disposed between the wider portion 16*b* and the bonding structure 18, and the wider portion 16*b* is disposed between the narrower portion 16*a* and the substrate 12. In other words, as illustrated in FIG. 1B, the interconnect structure 16 includes a ring-shaped indentation 20*a* resulted from the afore-mentioned pre-cut process, and the ring-shaped indentation 20*a* is distributed around sidewalls of the narrower portion 16*a* and sidewalls of the bonding dielectric layer 18*a*.

Figure 1C:
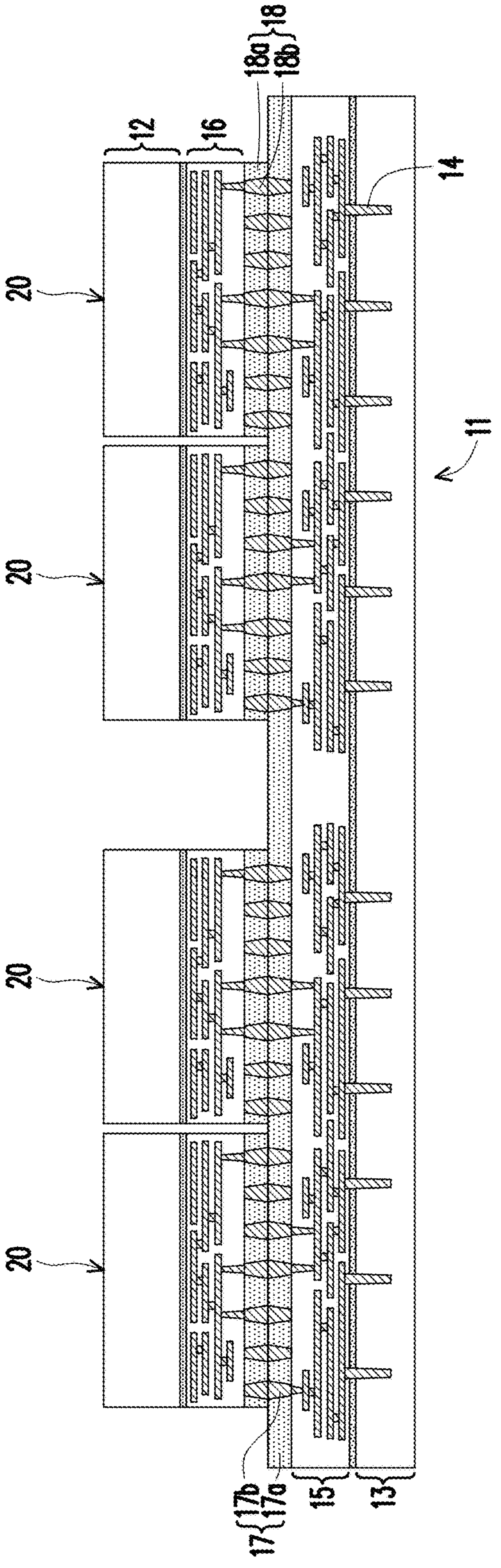

Referring to FIG. 1C, a semiconductor wafer 11 including semiconductor dies is provided, and the semiconductor dies 20 are picked-up, placed on and bonded to the semiconductor wafer 11. The singulated semiconductor dies 20 placed on the semiconductor wafer 11 may be classified into multiple groups of semiconductor dies 20. After semiconductor dies 20 are picked-up, placed on and bonded to the semiconductor wafer 11, a chip probing process may be performed to increase yields. The semiconductor dies in the semiconductor wafer 11 may be logic dies, System-on-Chip (SoC) dies or other suitable semiconductor dies. The semiconductor dies 20 and the semiconductor dies in the semiconductor wafer 11 may perform the same function or different functions. In some embodiments, the semiconductor dies 20 and the semiconductor dies in the semiconductor wafer 11 are System on Chip (SoC) dies. The semiconductor wafer 11 may include a substrate 13 (e.g., a semiconductor substrate), through substrate vias 14 embedded in the substrate 13, an interconnect structure 15 disposed on the substrate 13, and a bonding structure 17 disposed on the interconnect structure 15, wherein the through substrate vias 14 are electrically connected to the interconnect structure 15. The substrate 13 of the semiconductor wafer 11 may include a crystalline silicon wafer. The substrate 13 may include various doped regions depending on design requirements (e.g., p-type substrate or n-type substrate). In some embodiments, the doped regions may be doped with p-type or n-type dopants. The doped regions may be doped with p-type dopants, such as boron or $BF_2$; n-type dopants, such as phosphorus or arsenic; and/or combinations thereof. The doped regions may be configured for n-type Fin-type Field Effect Transistors (FinFETs) and/or p-type FinFETs. In some alternative embodiments, the substrate 13 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

The through substrate vias 14 may be formed by forming recesses in the substrate 13 by, for example, etching, milling, laser techniques, a combination thereof, and/or the like. A thin barrier layer may be conformally deposited over the front side of the substrate 13 and in the openings, such as by chemical vapor deposition (CVD), atomic layer deposition (ALD), physical vapor deposition (PVD), thermal oxidation, a combination thereof, and/or the like. The barrier layer may comprise a nitride or an oxynitride, such as titanium nitride, titanium oxynitride, tantalum nitride, tantalum oxynitride, tungsten nitride, a combination thereof, and/or the like. A conductive material is deposited over the thin barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer may be removed from the front side of the substrate 13 by, for example, chemical mechanical polishing (CMP). Thus, in some embodiments, the through substrate vias 14 may comprise a conductive material and a thin barrier layer between the conductive material and the substrate 13. In some embodiments, the through substrate vias 14 may extend through one or more layers of the interconnect structure 15 and protrude into the substrate 13. As illustrated in FIG. 1C, the through substrate vias 14 are buried in the substrate 13 and the interconnect structure 15. The through semiconductor vias 14 are not revealed from a back surface of the substrate 13 at this stage.

The interconnect structure 15 may include one or more dielectric layers (for example, one or more interlayer dielectric (ILD) layers, intermetal dielectric (IMD) layers, or the like) and interconnect wirings embedded in the one or more dielectric layers, and the interconnect wirings are electrically connected to the semiconductor devices (e.g., FinFETs) formed in the substrate 12. The material of the one or more dielectric layers may include silicon oxide ($SiO_x$, where x>0), silicon nitride ($SiN_x$, where x>0), silicon oxynitride ($SiO_xN_y$, where x>0 and y>0) or other suitable dielectric material. The interconnect wirings may include metallic wirings. For example, the interconnect wirings include copper wirings, copper pads, aluminum pads or combinations thereof.

The bonding structure 17 may include a bonding dielectric layer 17*a* and bonding conductors 17*b* embedded in the bonding dielectric layer 17*a*. The material of the bonding dielectric layer 17*a* may be silicon oxide ($SiO_x$, where x>0), silicon nitride ($SiN_x$, where x>0), silicon oxynitride ($SiO_xN_y$, where x>0 and y>0) or other suitable dielectric material, and the bonding conductors 17*b* may be conductive vias (e.g., copper vias), conductive pads (e.g., copper pads) or combinations thereof. The bonding structure 17 may be formed by depositing a dielectric material through a chemical vapor deposition (CVD) process (e.g., a plasma enhanced CVD process or other suitable process); patterning the dielectric material to form the bonding dielectric layer 17*a* including openings or through holes; and filling conductive material in the openings or through holes defined in the bonding dielectric layer 17*a* to form the bonding conductors 17*b* embedded in the bonding dielectric layer 17*a*.

The singulated semiconductor dies 20 are picked-up, placed on and bonded to the semiconductor wafer 11 through a chip-to-wafer bonding process such that the bonding structures 18 of the singulated semiconductor dies 20 are in contact with the bonding structure 17 of the semiconductor wafer 11. A chip-to-wafer bonding process is performed to bond the bonding structures 18 of the singulated semiconductor dies 20 with the bonding structure 17 of the semiconductor wafer 11. The chip-to-wafer bonding process may be a hybrid bonding process that includes dielectric-to-dielectric bonding and metal-to-metal bonding. After performing the above-mentioned chip-to-wafer bonding process, a dielectric-to-dielectric bonding interface is formed between the bonding dielectric layer 18*a* and the bonding dielectric layer 17*a*, and metal-to-metal bonding interfaces are formed between the bonding conductors 18*c* and bonding conductors 17*b*.

Figure 1D:
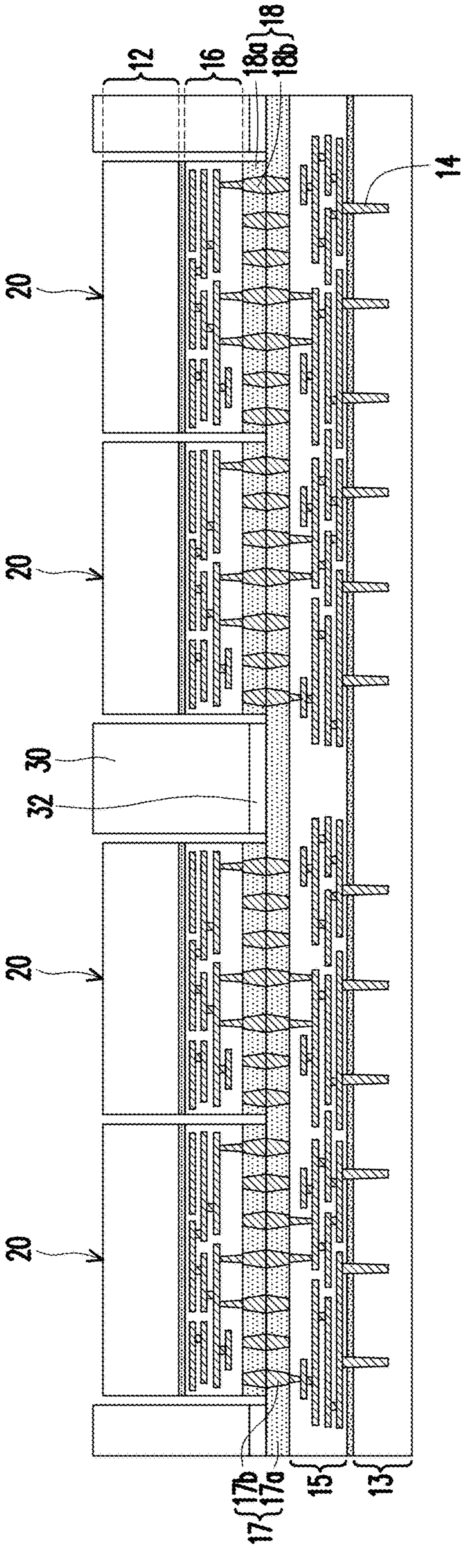
Figure 3A:
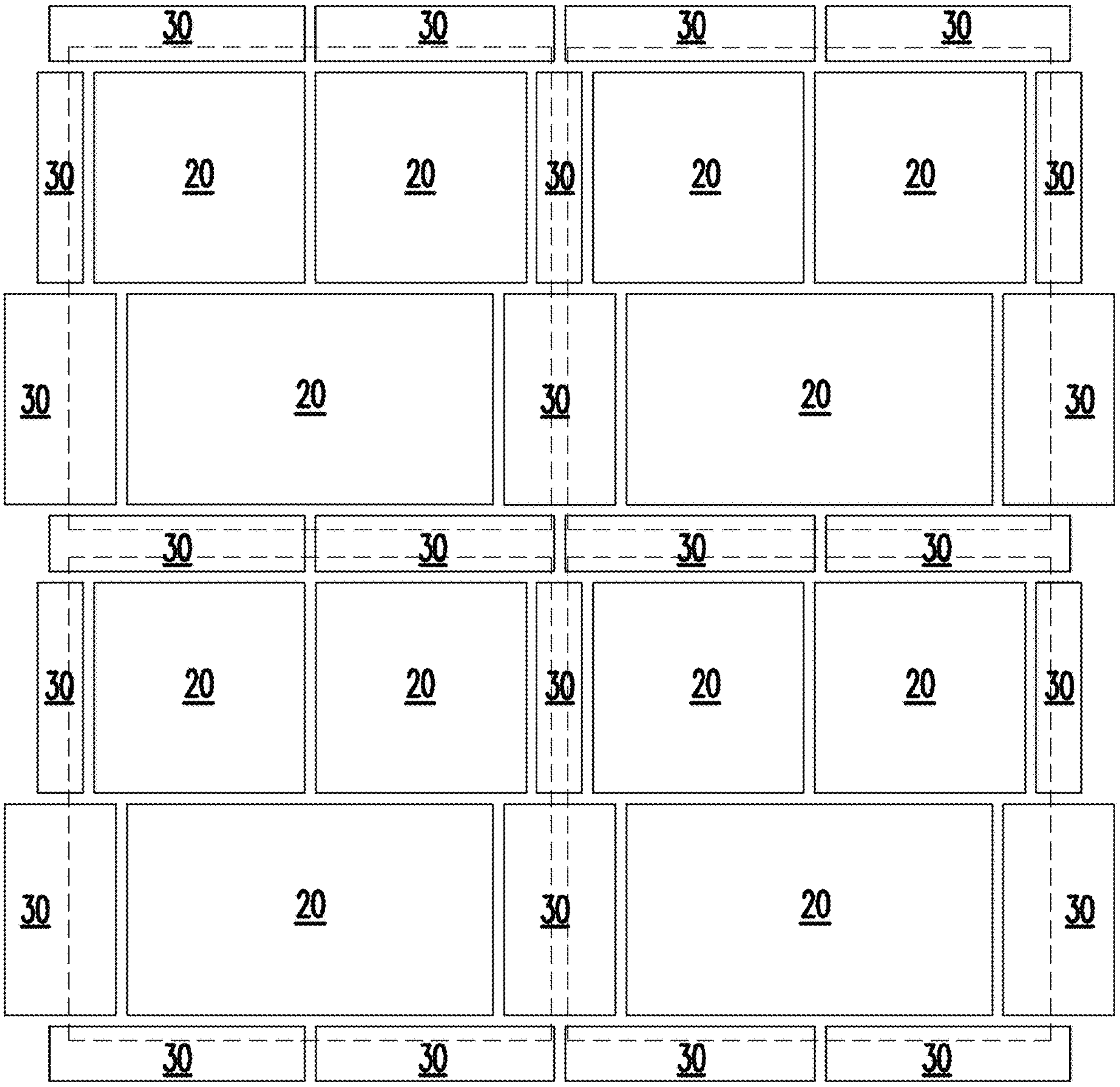
FIG. 3A is a top view schematically illustrating the distribution of the dummy dies 30 and the groups of the semiconductor dies 20 in accordance with some embodiments of the present disclosure.

Referring to FIG. 1D, dummy dies 30 are provided. The dummy dies 30 are picked-up, placed on and attached to the semiconductor wafer 11 through a chip-to-wafer bonding process such that the dummy dies 30 are in contact with and attached to the bonding structure 17 of the semiconductor wafer 11. The dummy dies 30 are disposed in gaps between the semiconductor dies 20. The dummy dies 30 are laterally spaced apart from the semiconductor dies 20 by a lateral distance ranging from about 30 micrometers to about 50 micrometers. For example, the dummy dies 30 are laterally spaced apart from the semiconductor dies 20 by a lateral distance of about 40 micrometers. Furthermore, in some embodiments, the semiconductor dies 20 are laterally paced apart from each other by a lateral distance ranging from about 30 micrometers to about 50 micrometers. For example, the semiconductor dies are laterally paced apart from each other by a lateral distance of about 40 micrometers. In the embodiment where semiconductor dies 20 placed on the semiconductor wafer 11 are classified into multiple groups of semiconductor dies 20, the dummy dies 30 are placed on the semiconductor wafer to laterally surround each group of semiconductor dies 20, as illustrated in FIG. 3A. In other words, the multiple groups of semiconductor dies 20 are spaced apart from each other by the dummy dies 30, as illustrated in FIG. 3A.

As illustrated in FIG. 1D, the dummy dies 30 may be attached to the bonding structure 17 of the semiconductor wafer 11 through die attachment films (DAF) 32. In some embodiments, in order to facilitate the placement process of the dummy dies 30, the top surfaces of the dummy dies 30 are higher than the top surfaces of the semiconductor dies 20. In other words, the overall thickness of the dummy dies 30 and the die attachment films 32 may be greater than the thickness of the semiconductor dies 20. The material of the dummy dies 30 may be the same as the material of the substrate 13 in the semiconductor wafer 11 and/or the material of the substrate 12 in the semiconductor dies 20. The coefficient of thermal expansion (CTE) of the dummy dies 30 may substantially equal to the CTE of the substrate 13 in the semiconductor wafer 11 and/or the CTE of the substrate 12 in the semiconductor dies 20. In some embodiment, the dummy dies 30 are crystalline silicon dummy dies. In some alternative embodiments, the dummy dies 30 are made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In some embodiments, the dummy dies 30 are electrically floated. In some embodiments, the dummy dies 30 are electrically insulated from the semiconductor dies 20 and the semiconductor wafer 11. In some embodiments, the dummy dies 30 provide no electrical function. In the embodiment where the CTE of the dummy dies 30 substantially equals to the CTE of the substrate 13 in the semiconductor wafer 11 and/or the CTE of the substrate 12 in the semiconductor dies 20, the dummy dies 30 may provide proper warpage reduction function.

Figure 1E:
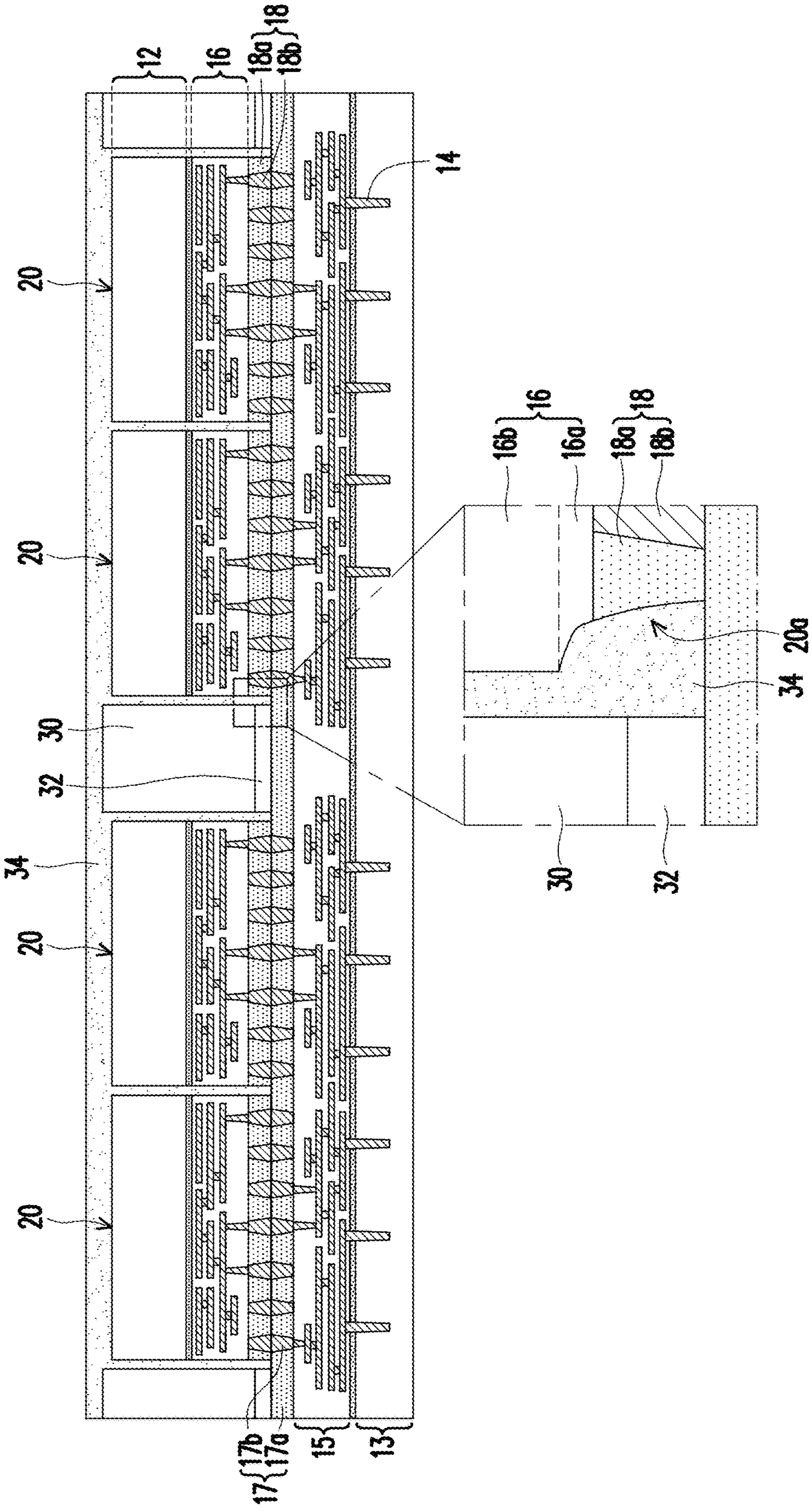

Referring to FIG. 1E, a gap filling material 34 is formed on the semiconductor wafer 11 to cover the semiconductor dies 20. The gap filling material 34 may be a dielectric material (e.g., TEOS formed oxide or other suitable dielectric material), a molding compound (e.g., epoxy or other suitable resin) formed through a gap filling process, an over-molding process, or the like. The gap filling material 34 fills gaps between neighboring semiconductor dies 20, gaps between neighboring dummy dies 30 as well as gaps between the dummy dies 30 and the semiconductor dies 20 adjacent to the dummy dies 30. As illustrated in FIG. 1E, the gap filling material 34 is formed to fill the ring-shaped indentation 20*a* such that the gap filling material 34 is in contact with sidewalls of the narrower portion 16*a* and sidewalls of the bonding dielectric layer 18*a*. In some embodiments, the gaps between neighboring semiconductor dies 20 ranges from about 30 micrometers to about 50 micrometers. For example, the gaps between neighboring semiconductor dies 20 is about 40 micrometers. In some embodiments, the gaps between neighboring dummy dies 30 ranges from about 30 micrometers to about 50 micrometers. For example, the gaps between neighboring dummy dies 30 is about 40 micrometers. In some embodiments, the gaps between the dummy dies 30 and the semiconductor dies 20 adjacent to the dummy dies 30 ranges from about 30 micrometers to about 50 micrometers. For example, the gaps between the dummy dies 30 and the semiconductor dies 20 adjacent to the dummy dies 30 is about 40 micrometers.

In some embodiments, a first grinding process is performed to partially remove the gap filling material 34 such that the gap filling material 34 can be thinned down. After the first grinding process of the gap filling material 34 is performed, the semiconductor dies 20 and the dummy dies 30 are still covered by the gap filling material 34. The semiconductor dies 20 and the dummy dies 30 are not revealed from the top surface of the gap filling material 34 at this stage.

As illustrated in FIG. 1E, the placement of the dummy dies 30 reduces the overall amount of the gap filling material 34 which is formed to laterally encapsulate the semiconductor dies 20 and the dummy dies 30. Only small amount of gap filling material 34 is formed in the gaps between the neighboring semiconductor dies, the gaps between the neighboring dummy dies 30 and the gaps between the dummy dies 30 and the semiconductor dies 20. In some embodiments, the CTE of the gap filling material 34 is greater than the CTE of the semiconductor dies 20 and the semiconductor wafer 11. Furthermore, the CTE mismatch between the gap filling material 34 and the semiconductor dies 20 and/or the semiconductor wafer 11 is greater than the CTE mismatch between the dummy dies 30 and the semiconductor dies 20 and/or the semiconductor wafer 11. Since the CTE mismatch between the gap filling material 34 and the semiconductor dies 20 (or the semiconductor wafer 11) is greater than the CTE mismatch between the dummy dies 30 and the semiconductor dies 20 (or the semiconductor wafer 11), the warpage of the resulted structure (i.e., a reconstructed wafer structure) illustrated in FIG. 1E may be minimized.

Figure 1F:
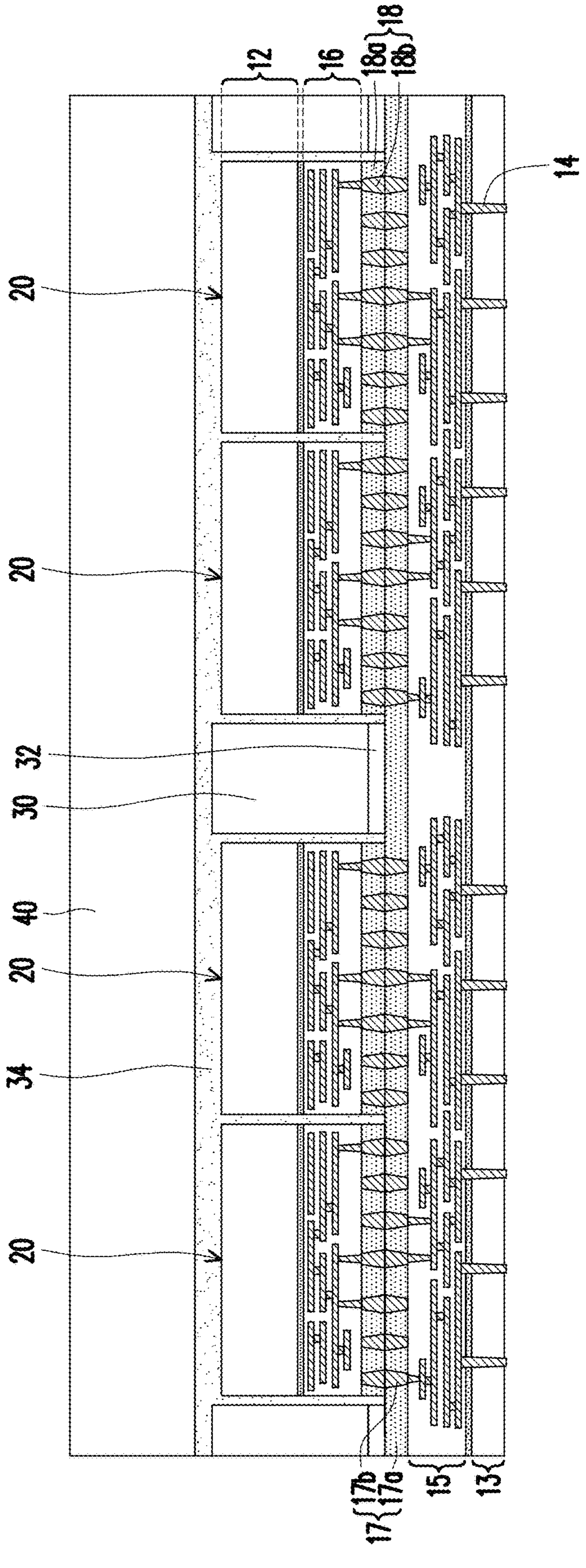

Referring to FIG. 1E and FIG. 1F, a carrier 40 is provided and the resulted structure illustrated in FIG. 1E is attached onto the carrier 40. In some embodiments, the carrier 40 is a glass substrate, a ceramic carrier, or the like. The carrier 40 may have a round top-view shape and a size of a silicon wafer. For example, the carrier 40 may have an 8-inch diameter, a 12-inch diameter, or the like. The carrier 40 may have a de-bonding layer formed thereon. The debonding layer formed on the carrier 40 may be or include a polymer-based material (e.g., a Light To Heat Conversion (LTHC) material), which may be subsequently removed along with the carrier 40 from the overlying structures that will be formed in subsequent steps. In some embodiments, the de-bonding layer is formed of an epoxy-based thermal-release material. In other embodiments, the de-bonding layer is formed of an ultra-violet (UV) glue. The de-bonding layer may be dispensed as a liquid and cured. In alternative embodiments, the de-bonding layer is a laminate film and is laminated onto the carrier 40. The top surface of the de-bonding layer is substantially planar.

As illustrated in FIG. 1F, after the resulted structure illustrated in FIG. 1E is attached onto the carrier 40, a removal process is performed to partially remove the semiconductor substrate 13 until the through semiconductor vias 14 are revealed from the back surface of the semiconductor substrate 13 of the semiconductor wafer 11. The through semiconductor vias 14 may protrude from the back surface of the semiconductor substrate 13 of the semiconductor wafer 11 at this stage. In some embodiments, the above-mentioned removal process of the semiconductor substrate 13 includes a chemical mechanical polishing (CMP) process, a mechanical grinding process, combinations thereof or the like.

Figure 1G:
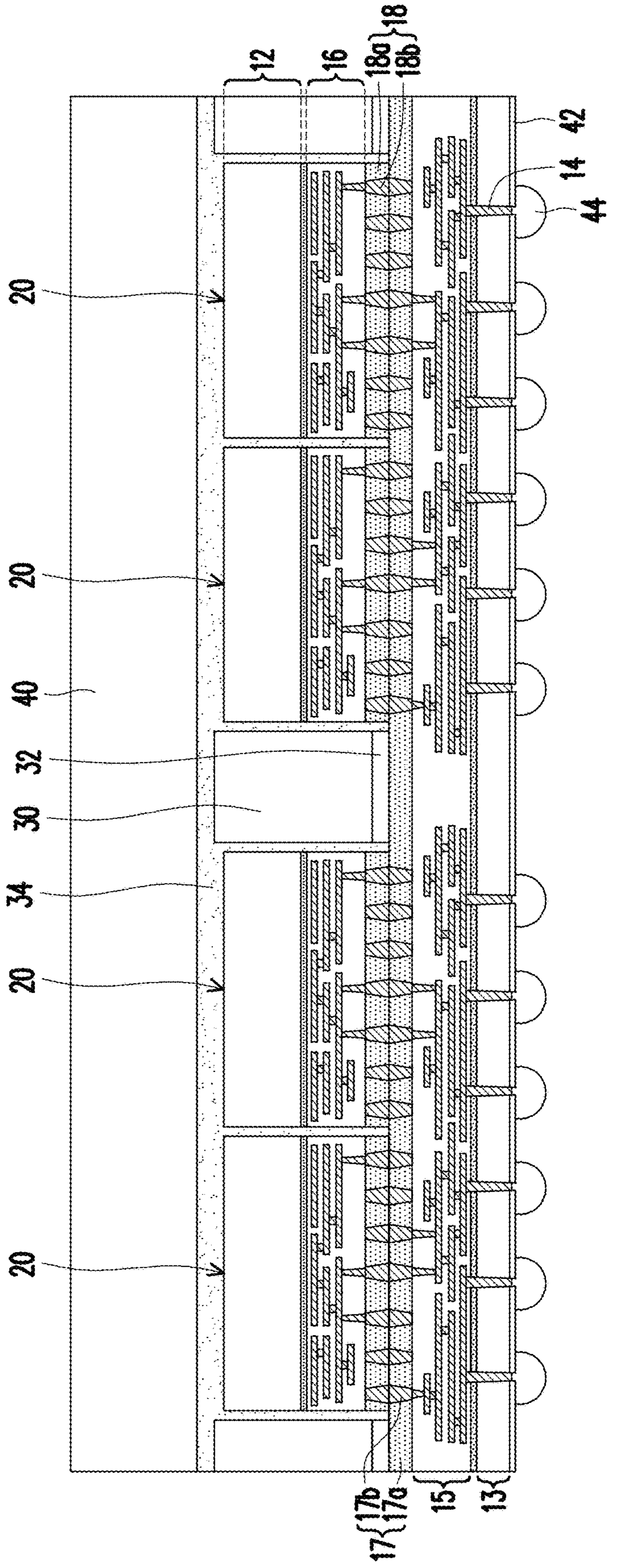

Referring to FIG. 1G, a patterned dielectric layer 42 having openings therein is formed over the back surface of the semiconductor substrates 13 such that the through semiconductor vias 14 are revealed by the openings of the patterned dielectric layer 42. The patterned dielectric layer 42 may be formed by a deposition process (e.g., CVD process or the like) of dielectric material followed by a patterning process (e.g., photolithography process). The patterned dielectric layer 42 may be or include silicon oxide ($SiO_x$, where x>0), silicon nitride ($SiN_x$, where x>0), silicon oxynitride ($SiO_xN_y$, where x>0 and y>0) or other suitable dielectric material.

As illustrated in FIG. 1G, after forming the patterned dielectric layer 42, conductive terminals 44 are formed over the patterned dielectric layer 42. The conductive terminals 44 are electrically connected to the through semiconductor vias 14. In some embodiments, the conductive terminals 44 includes controlled collapse chip connection (C4) bumps. The formation of the conductive terminals 46 may include forming an under bump metallurgy (UBM) layer (not shown) over the patterned dielectric layer 42, forming a patterned mask (not shown) such as a photoresist layer over the UBM layer, and then performing a plating process on the exposed UBM layer. The patterned mask and the portions of the UBM layer covered by the patterned mask are then removed, leaving the conductive terminals 44. A reflow process may be further performed to re-shape the profile of the conductive terminals 44. In accordance with some embodiments, the UBM layer includes a titanium layer and a copper layer over the titanium layer. The UBM layer may be formed using, for example, Physical Vapor Deposition (PVD). The plating may be performed using, for example, electroless plating. In some embodiments, the conductive terminals 44 are further covered by a protection layer (illustrated as dashed line in FIG. 1J).

Figure 1H:
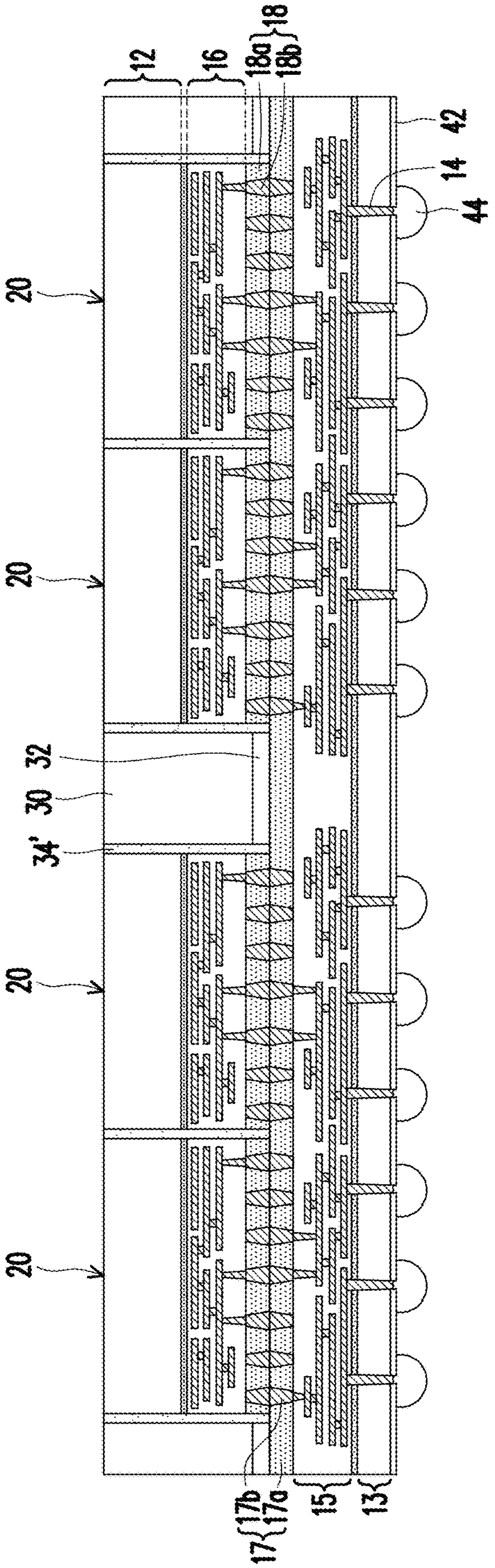

Referring to FIG. 1G and FIG. 1H, after forming the conductive terminals 44, a second grinding process is performed to partially remove the gap filling material 34 until the substrates 10 of the semiconductor dies 20 and the dummy dies 30 are revealed such that a gap filling layer 34' is formed. The second grinding process of the gap filling material 34 include a chemical mechanical polishing (CMP) process, a mechanical grinding process, combinations thereof or the like. After performing the second grinding process, the top surface of the gap filling layer 34' is substantially level with the back surfaces of the semiconductor dies 20 and the top surfaces of the dummy dies 30. During the second grinding process of the gap filling material 34, the dummy dies 30 are partially removed as well. The dummy dies 30 are thinned down until the back surfaces of the semiconductor dies 20 substantially level with the top surfaces of the dummy dies 30.

In some other embodiments, due to the grinding selectivity of the second grinding process, the top surface of the gap filling layer 34' may be slightly lower or higher than the back surfaces of the semiconductor dies 20 and the top surfaces of the dummy dies 30.

Figure 1I:
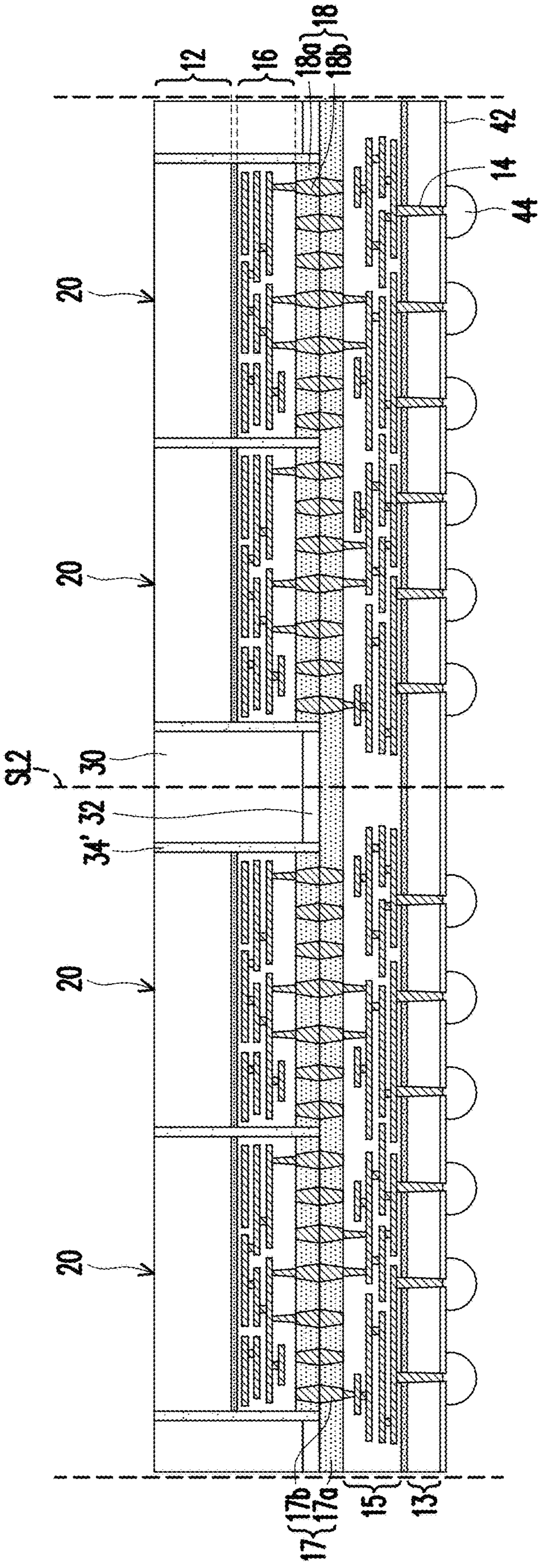
Figure 1J:
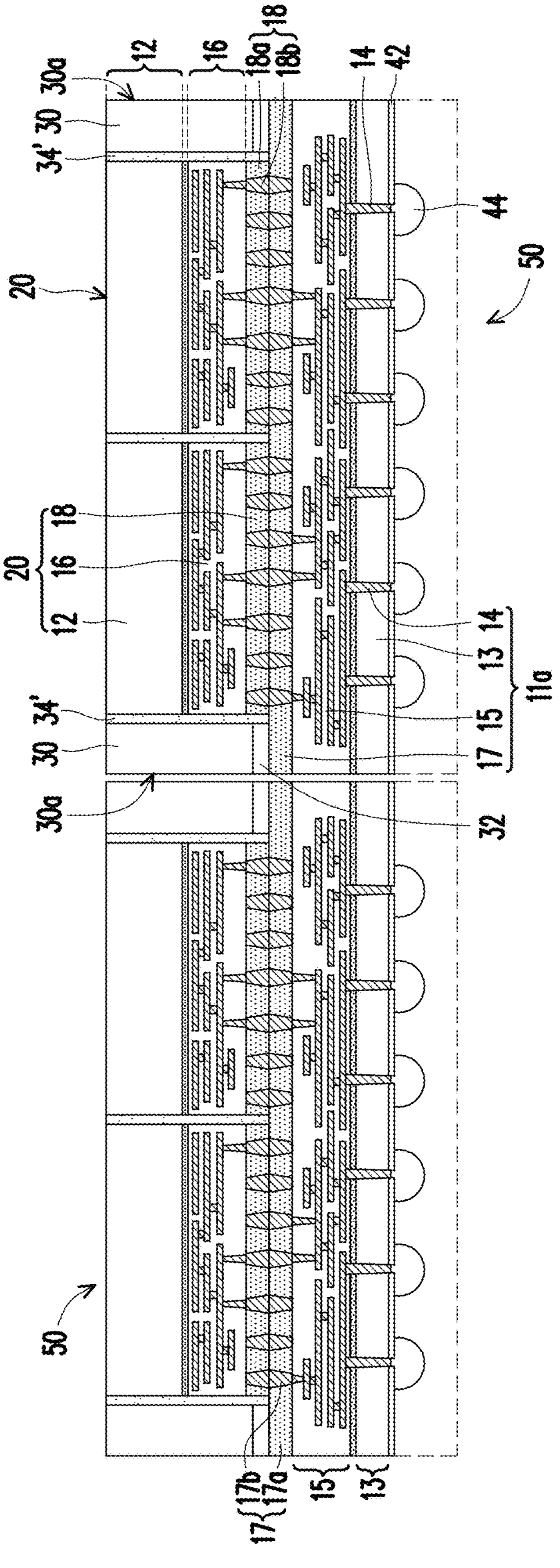

Referring to FIG. 1I and FIG. 1J, the resulted structure (i.e., a reconstructed wafer structure) illustrated in FIG. 1I is singulated by a wafer sawing process performed along scribe lines SL2 such that singulated device dies or SoIC structures 50 illustrated in FIG. 1J are obtained.

Figure 3B:
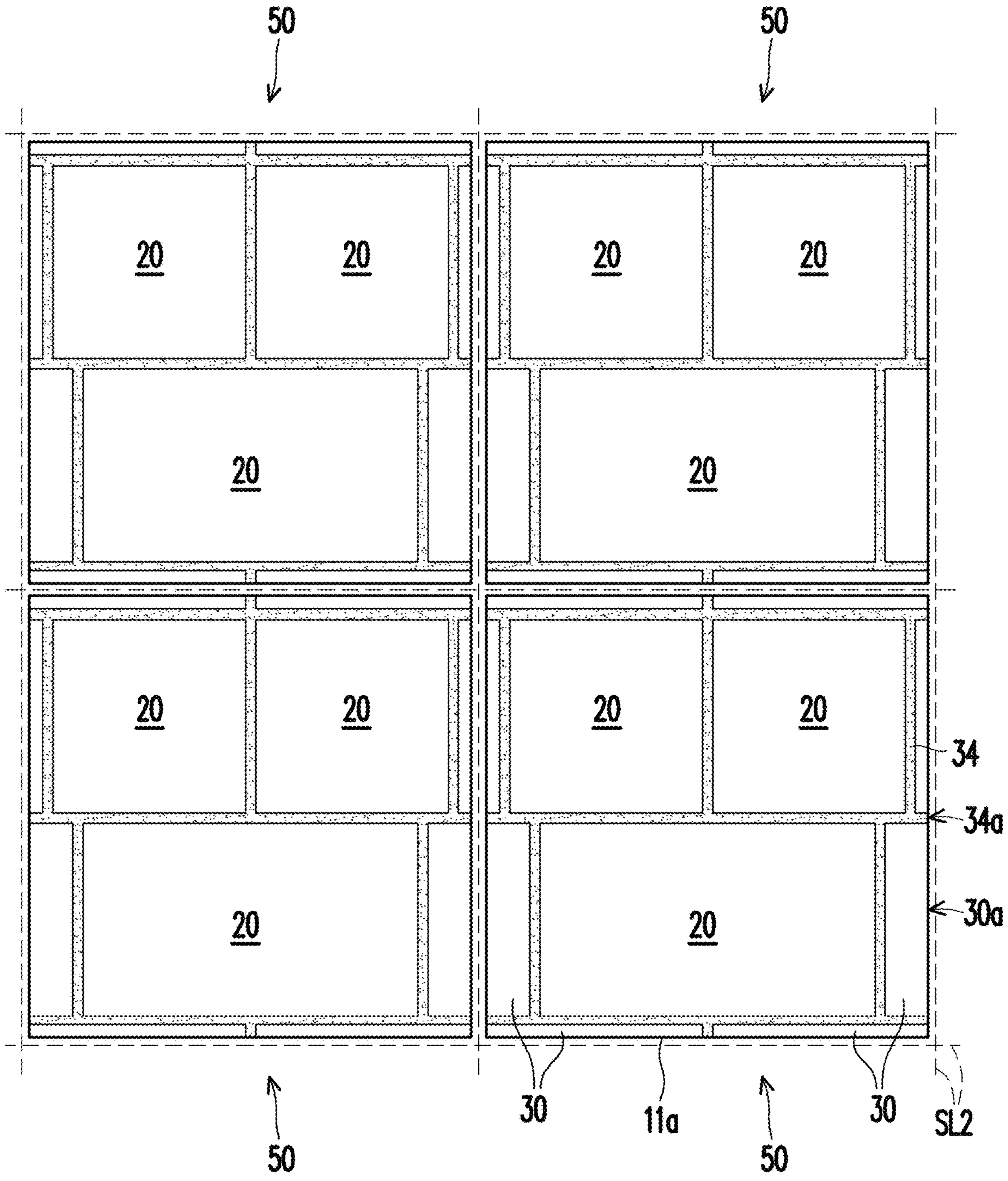
FIG. 3B is a top view schematically illustrating the SoIC structures 50 in accordance with some embodiments of the present disclosure.

As illustrated in FIG. 1J, the singulated SoIC structures 50 may include a first semiconductor die **11*a*, second semiconductor dies 20, dummy dies 30, and a gap filling layer 34 is provided. The second semiconductor dies 20 are disposed over (or stacked over) and electrically connected to the first semiconductor die 11*a*. The dummy dies 30 are disposed over (or stacked over) the first semiconductor die 11*a* to laterally surround the second semiconductor dies 20, as illustrated in FIG. 3B. The gap filling layer 34 is disposed on the first semiconductor die 11*a* to laterally encapsulate the dummy dies 30 and the second semiconductor dies 20. As illustrated in FIG. 3B, in the singulated SoIC structures 50, the dummy dies 30 have various geometries, for example, the dummy dies 30 are substantially identical in thickness, and the dummy dies 30 are different in length and/or width. Furthermore, as illustrated in FIG. 3B, in the singulated SoIC structures 50, the gap filling layer 34 includes multiple segments for separating neighboring second semiconductor dies 20, and the multiple segments may be substantially identical in width. In some embodiments, the first semiconductor die 11***a* includes a first bonding structure 17, each of the second semiconductor dies 20 includes a second bonding structure 18, and the second bonding structure 18 of each of the second semiconductor dies 20 is in contact with and electrically connected to the first bonding structure 17 of the first semiconductor die 11*a*. In some embodiments, each of the dummy dies 30 includes an outer sidewall 30*a*, and the outer sidewall 30*a* of each of the dummy dies 30 is substantially aligned with a sidewall of the first bonding structure 17. In some embodiments, the dummy dies 30 are spaced apart from the second bonding structure 18 of each of the second semiconductor dies 20 by the gap filling layer 34. In some embodiments, each of the dummy dies 30 is laterally spaced apart from one of the second semiconductor dies 20 by the gap filling layer 34. In some embodiments, each of the dummy dies 30 includes an outer sidewall 30*a*, and the outer sidewall 30*a* is substantially aligned with a sidewall of the first semiconductor die 11*a*. In some embodiments, two neighboring second semiconductor dies 20 among the second semiconductor dies 20 are laterally spaced apart from each other by the gap filling layer 34. In some embodiments, two neighboring dummy dies 30 among the dummy dies 30 are laterally spaced apart from each other by the gap filling layer 34. In some embodiments, the SoIC structure 50 further includes die attachment films 32, wherein each of the dummy dies 30 is attached onto the first semiconductor die 11*a* through one of the die attachment films 32, respectively.

In some embodiments, each of the dummy dies 30 includes an outer sidewall 30*a*, and the outer sidewall 30*a* of each of the dummy dies 30 is substantially aligned with a sidewall of the gap filling layer 34. The outer sidewalls 30*a* of the dummy dies 30 may include scratch marks resulted from the above-mentioned wafer saw process, and the top surfaces of the dummy dies 30 may include grinding marks resulted from the above-mentioned second grinding process. The roughness of the outer sidewalls 30*a* of the dummy dies 30 may be greater than the roughness of the top surfaces of the dummy dies 30. The roughness of the bottom surfaces of the dummy dies 30 may be smaller than the roughness of the top surfaces of the dummy dies 30 since no grinding process is performed on the bottom surfaces of the dummy dies 30. Similarly, the outer sidewalls 34*a* (shown in FIG. 3B) of the gap filling layer 34 may include scratch marks resulted from the above-mentioned wafer saw process, and the top surfaces of the gap filling layer 34 may include grinding marks resulted from the above-mentioned second grinding process. The roughness of the outer sidewalls 34*a* of the gap filling layer 34 may be greater than the roughness of the top surfaces of the gap filling layer 34. In some embodiments, the dummy dies 30 are electrically floated. In some embodiments, the dummy dies 30 are electrically insulated from the first semiconductor die 11*a* and the second semiconductor dies 20. In some embodiments, the dummy dies 30 are electrically insulted from each other. In some embodiments, a first coefficient of thermal expansion (CTE) mismatch between the gap filling layer 34 and the first semiconductor die 11*a* is greater than a second CTE mismatch between the dummy dies 30 and the first semiconductor die 11*a*. In some embodiments, a first coefficient of thermal expansion (CTE) of the gap filling layer 34 is greater than a second CTE of the dummy dies 30 or the second semiconductor dies 20.

In some alternative embodiments of the disclosure, the first semiconductor die 11*a* includes a bottom tier semiconductor die, second semiconductor dies 20 include top tier semiconductor dies, and the dummy dies 30 include a group of warpage control components, wherein a first coefficient of thermal expansion (CTE) of the gap filling layer 34 is greater than a second CTE of the group of warpage control components 30 and/or the top tier semiconductor dies 20. In some embodiments, each warpage control component 30 includes an outer sidewall 30*a*, and the outer sidewall 30*a* of each warpage control component 30 is substantially aligned with a sidewall of the gap filling layer 34. In some embodiments, each warpage control component 30 includes an outer sidewall 30*a*, and the outer sidewall 30*a* of each warpage control component 30 is substantially aligned with a sidewall of the bottom tier semiconductor die 11*a*. In some embodiments, each warpage control component 30 is laterally spaced apart from one of the top tier semiconductor dies 20 by a lateral distance ranging from about 30 micrometers to about 50 micrometers. In some embodiments, the group of warpage control components 30 are electrically floated. In some embodiments, the second semiconductor dies (e.g., top tier semiconductor dies) 20 are laterally paced apart from each other by a lateral distance ranging from about 30 micrometers to about 50 micrometers. For example, the second semiconductor dies (e.g., top tier semiconductor dies) are laterally paced apart from each other by a lateral distance of about 40 micrometers.

In such configuration of the SoIC structure 50, the dummy dies 30 may minimize warpage of the SoIC structure 50 because the amount of the gap filling layer 34 is reduced by the dummy dies 30. Accordingly, delamination issue occurred between the first bonding structure 17 and the second bonding structures 18 may be improved, and fabrication yields of the SoIC structure 50 may be enhanced.

Figure 2A:
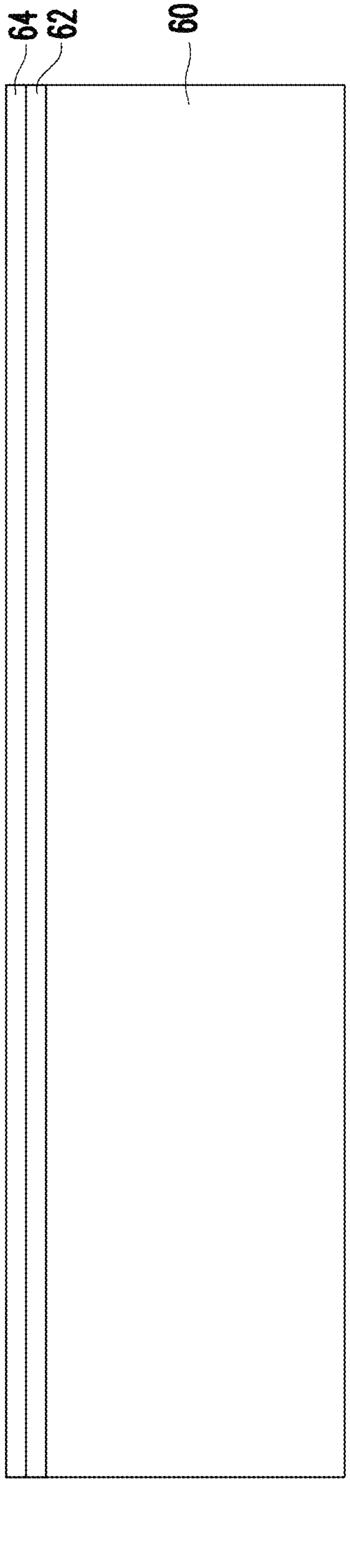
FIG. 2A through FIG. 2M are cross-sectional views schematically illustrating a process flow for fabricating integrated fan-out (InFO) package structures of SoIC structure in accordance with some embodiments of the present disclosure.

FIG. 2A through FIG. 2M are cross-sectional views schematically illustrating a process flow for fabricating integrated fan-out (InFO) package structures of SoIC structure in accordance with some embodiments of the present disclosure. FIG. 2A through FIG. 2N illustrate the packaging process of the SoIC structure 50 shown in FIG. 1J to form InFO package structures, so that the overlying electrical connectors (such as solder regions) may be distributed to regions larger than the SoIC structure 50.

Referring to FIG. 2A, a carrier 60 including a de-bonding layer 62 formed thereon is provided. In some embodiments, the carrier 60 is a glass substrate, a ceramic carrier, or the like. The carrier 60 may have a round top-view shape and a size of a silicon wafer. For example, carrier 60 may have an 8-inch diameter, a 12-inch diameter, or the like. The de-bonding layer 62 may be formed of a polymer-based material (e.g., a Light To Heat Conversion (LTHC) material), which may be subsequently removed along with the carrier 60 from the overlying structures that will be formed in subsequent steps. In some embodiments, the de-bonding layer 62 is formed of an epoxy-based thermal-release material. In other embodiments, the de-bonding layer 62 is formed of an ultra-violet (UV) glue. The de-bonding layer 62 may be dispensed as a liquid and cured. In alternative embodiments, the de-bonding layer 62 is a laminate film and is laminated onto the carrier 60. The top surface of the de-bonding layer 62 is substantially planar.

Figure 2B:
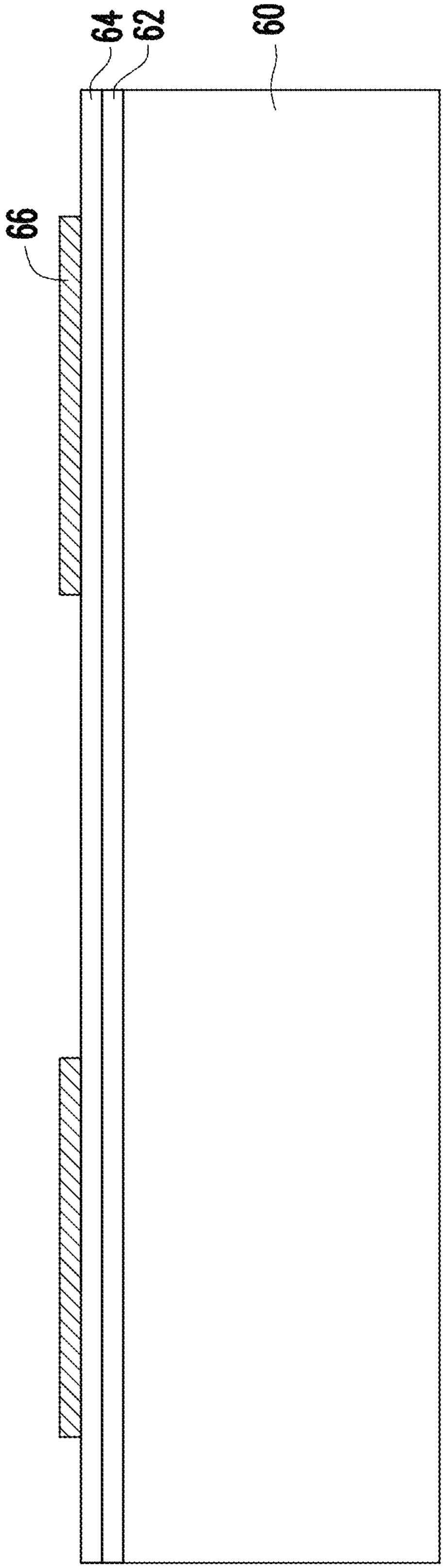
Figure 2C:
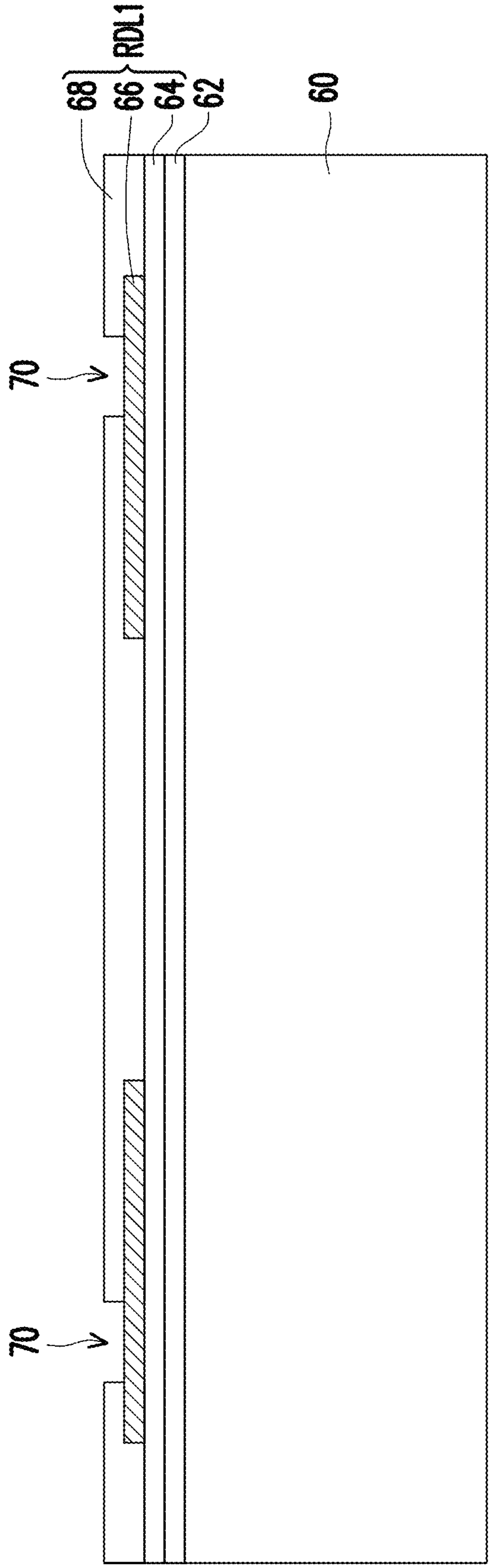

Referring to FIG. 2A through FIG. 2C, a redistribution circuit structure 61 including a dielectric layer 64, redistribution wirings 66 and a dielectric layer 68 is formed on the de-bonding layer 62 such that the de-bonding layer 62 is between the carrier 60 and the dielectric layer 64 of the redistribution circuit structure 61. As shown in FIG. 2A, the dielectric layer 64 is formed on the de-bonding layer 62. In some embodiments, the dielectric layer 64 is formed of a polymer, which may also be a photo-sensitive material such as polybenzoxazole (PBO), polyimide, benzocyclobutene (BCB), or the like, which may be easily patterned using a photolithography process. In some embodiments, the dielectric layer 64 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like. As shown in FIG. 2B, the redistribution wirings 66 are formed over the dielectric layer 64. The formation of the redistribution wirings 66 may include forming a seed layer (not shown) over the dielectric layer 64, forming a patterned mask (not shown) such as a photoresist layer over the seed layer, and then performing a plating process on the exposed seed layer. The patterned mask and the portions of the seed layer covered by the patterned mask are then removed, leaving the redistribution wirings 66 as shown in FIG. 2B. In accordance with some embodiments, the seed layer includes a titanium layer and a copper layer over the titanium layer. The seed layer may be formed using, for example, Physical Vapor Deposition (PVD). The plating may be performed using, for example, electroless plating. As shown in FIG. 2C, the dielectric layer 68 is formed over the dielectric layer 64 to cover the redistribution wirings 66. The bottom surface of the dielectric layer 68 is in contact with the top surfaces of the redistribution wirings 66 and the dielectric layer 64. In accordance with some embodiments of the present disclosure, the dielectric layer 68 is formed of a polymer, which may be a photo-sensitive material such as PBO, polyimide, BCB, or the like. In some embodiments, the dielectric layer 68 is formed of a nitride such as silicon nitride, an oxide such as silicon oxide, PSG, BSG, BPSG, or the like. The dielectric layer 68 is then patterned to form openings 70 therein. Hence, portions of the redistribution wirings 66 are exposed through the openings 70 in the dielectric layer 68. FIG. 2C and the subsequent figures illustrate a single redistribution circuit structure 61 having a single layer redistribution wirings 66 for illustrative purposes and some embodiments may have a plurality of layers of redistribution wirings 66 by repeating the process discussed above.

Figure 2D:
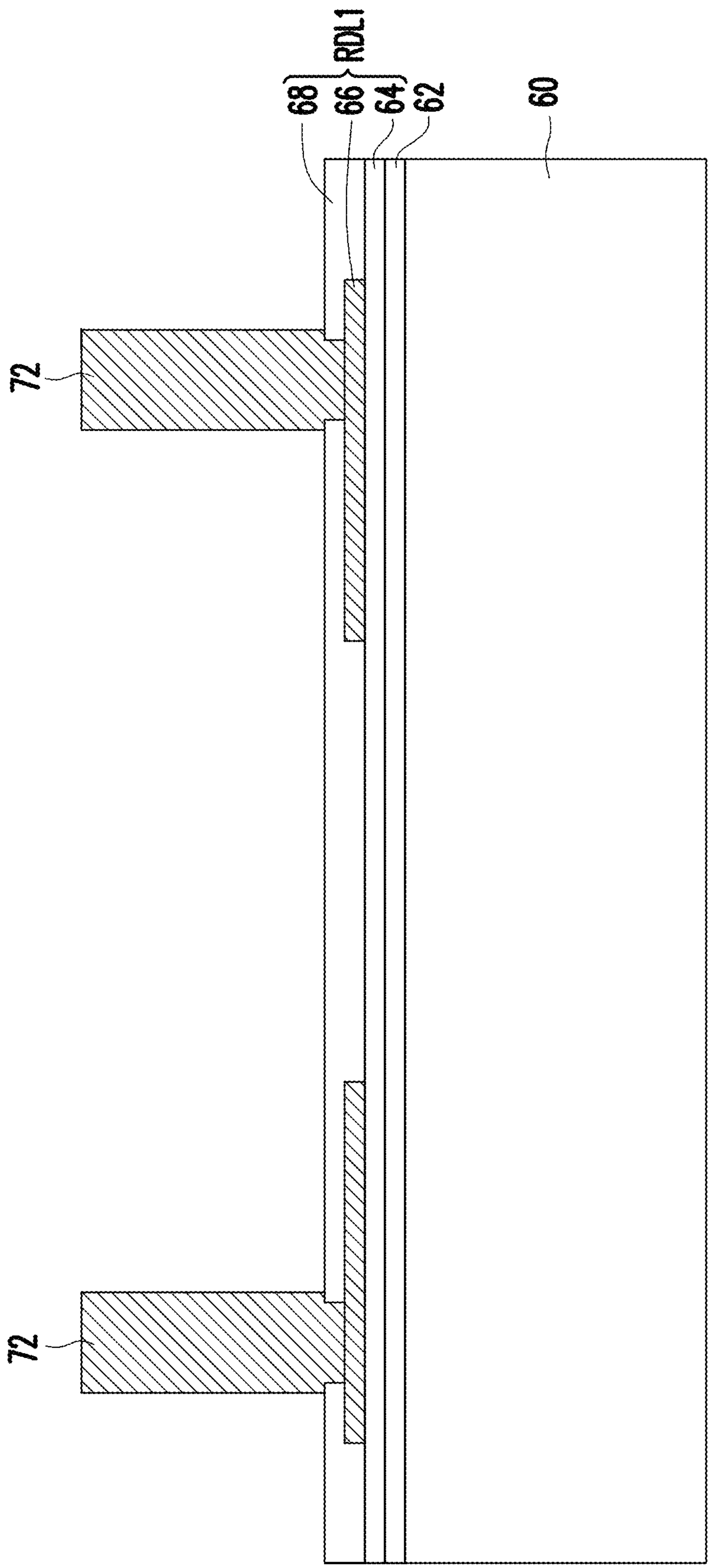

Referring to FIG. 2D, after forming the redistribution circuit structure 61 over the de-bonding layer 62 carried by the carrier 60, metal posts 72 are formed on the redistribution circuit structure 61 and electrically connected to the redistribution wirings 66 of the redistribution circuit structure 61. Throughout the description, the metal posts 72 are alternatively referred to as conductive through-vias 72 since the metal posts 72 penetrate through the subsequently formed molding material (shown in FIG. 2G). In some embodiments, the conductive through-vias 72 are formed by plating. The plating of the conductive through-vias 72 may include forming a blanket seed layer (not shown) over the dielectric layer 68 and extending into the openings 70 shown in FIG. 2C, forming and patterning a photoresist (not shown), and plating the conductive through-vias 72 on the portions of the seed layer that are exposed through the openings in the photoresist. The photoresist and the portions of the seed layer that were covered by the photoresist are then removed. The material of the conductive through-vias 72 may include copper, aluminum, or the like. The conductive through-vias 72 may have the shape of rods. The top-view shapes of the conductive through-vias 72 may be circles, rectangles, squares, hexagons, or the like.

Figure 2E:
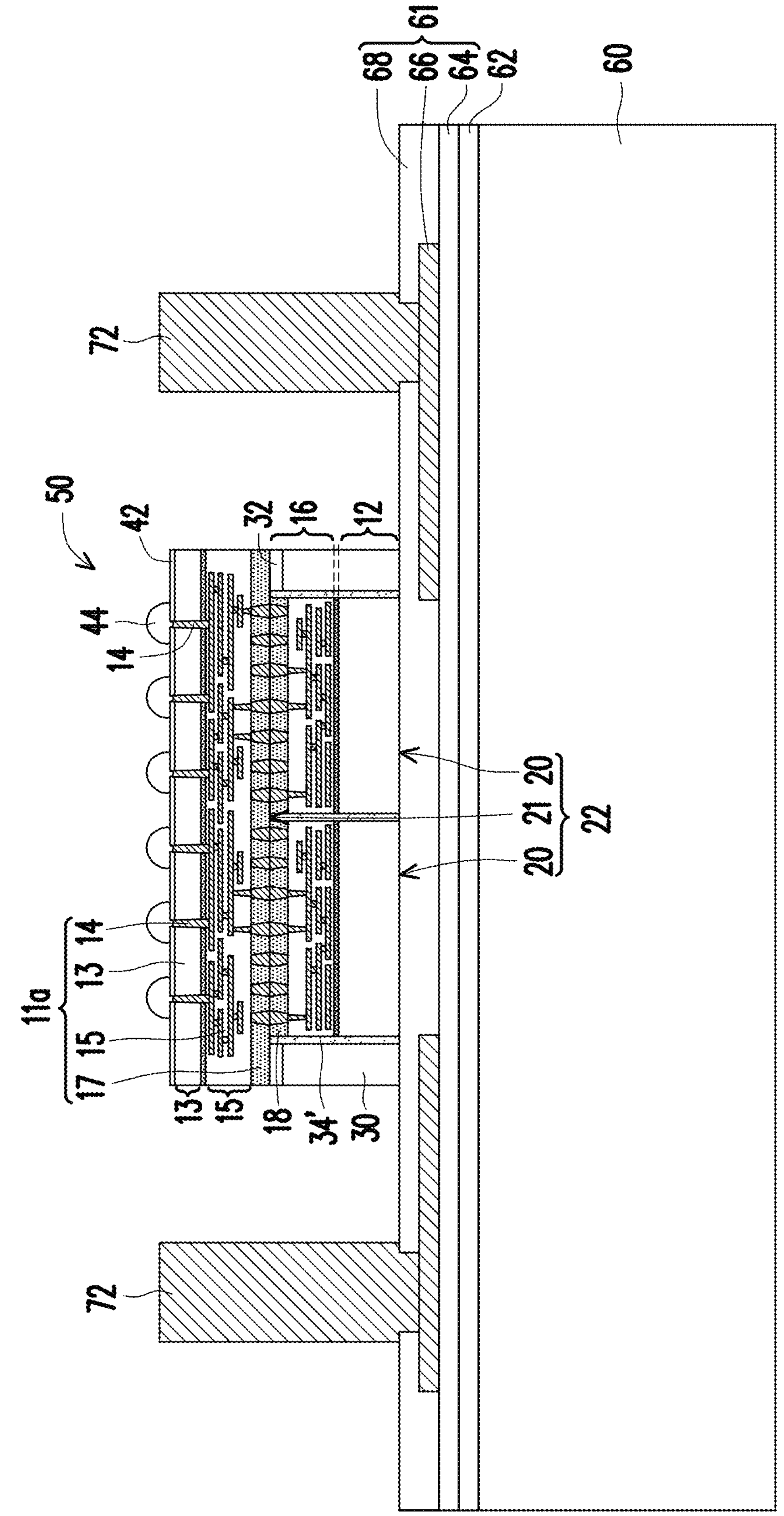

Referring FIG. 2E, after forming the conductive through vias 72, at least one singulated SoIC structure, e.g., such as that the singulated SoIC structure 50 shown in FIG. 1J, is picked-up and placed over the dielectric layer 68 of the redistribution circuit structure 61. Only a single singulated SoIC structure 50 and conductive through-vias 72 are illustrated in FIG. 2E for illustrative purposes. It is noted, however, that the process steps shown in FIG. 2A through FIG. 2N may be performed at wafer level, and are performed on all of the singulated SoIC structure 50 and the conductive through-vias 72 disposed over the carrier 60. As illustrated in FIG. 2E, the top tier semiconductor dies 20 are stacked over the bottom tier semiconductor die 11*a*, and the back surface of the bottom tier semiconductor die 11*a* in the singulated SoIC structure 50 is adhered to the dielectric layer 68 through, for example, a die-attachment film (not shown).

Figure 2F:
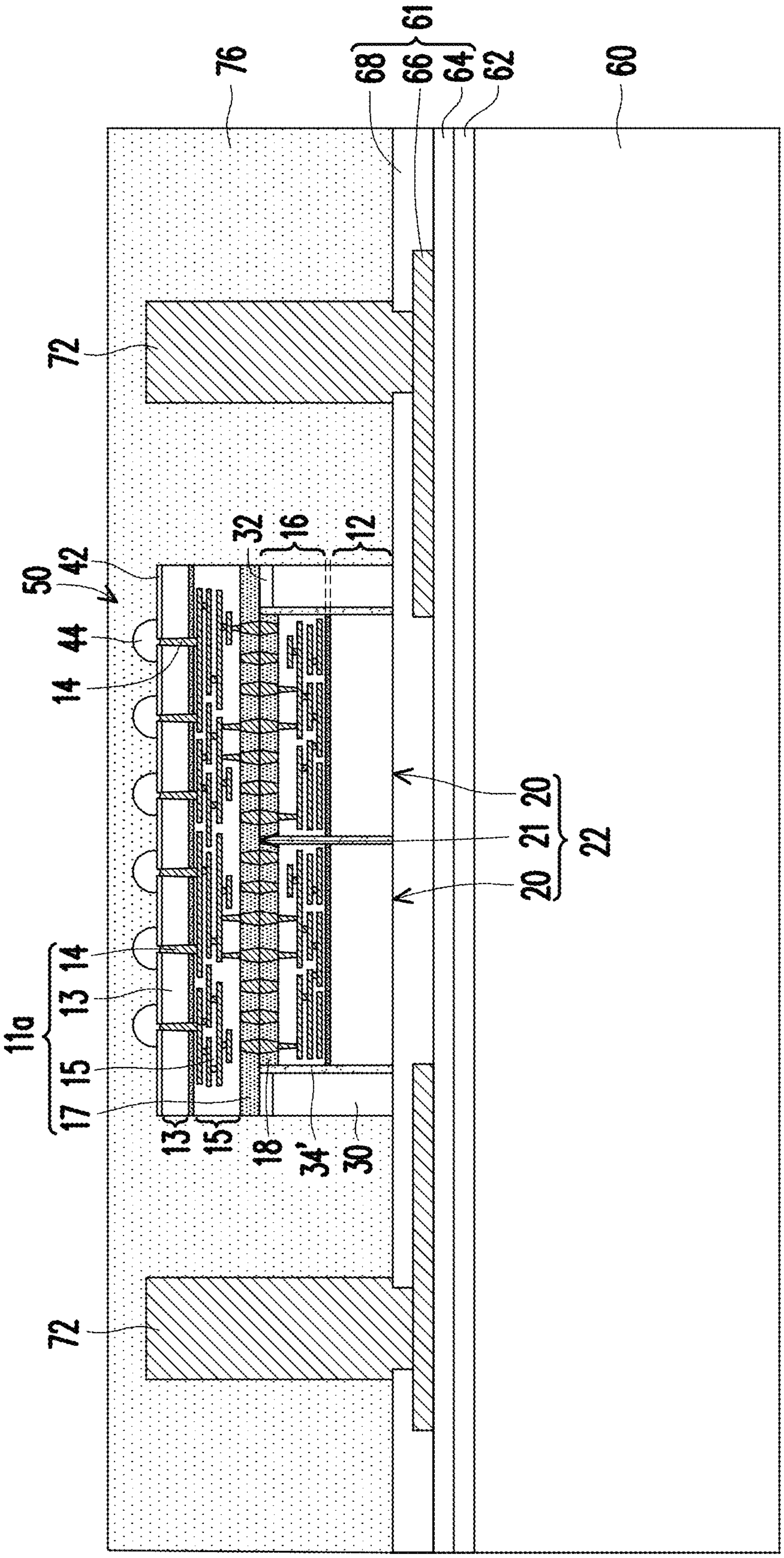

Referring to FIG. 2F, an insulating encapsulation material 76 is formed over the redistribution circuit structure 61 to cover the SoIC structure 50 and the conductive through-vias 72. The insulating encapsulation material 76 may be a molding compound (e.g., epoxy or other suitable resin) formed through an over-molding process. The insulating encapsulation material 76 fills the gaps between neighboring conductive through-vias 72, the gaps between the top tier semiconductor dies 20, and the gaps between the conductive through-vias 72 and the SoIC structure 50. The top surface of the insulating encapsulation material 76 is higher than the back surface of the top tier semiconductor dies 20 and the conductive through-vias 72.

Figure 2G:
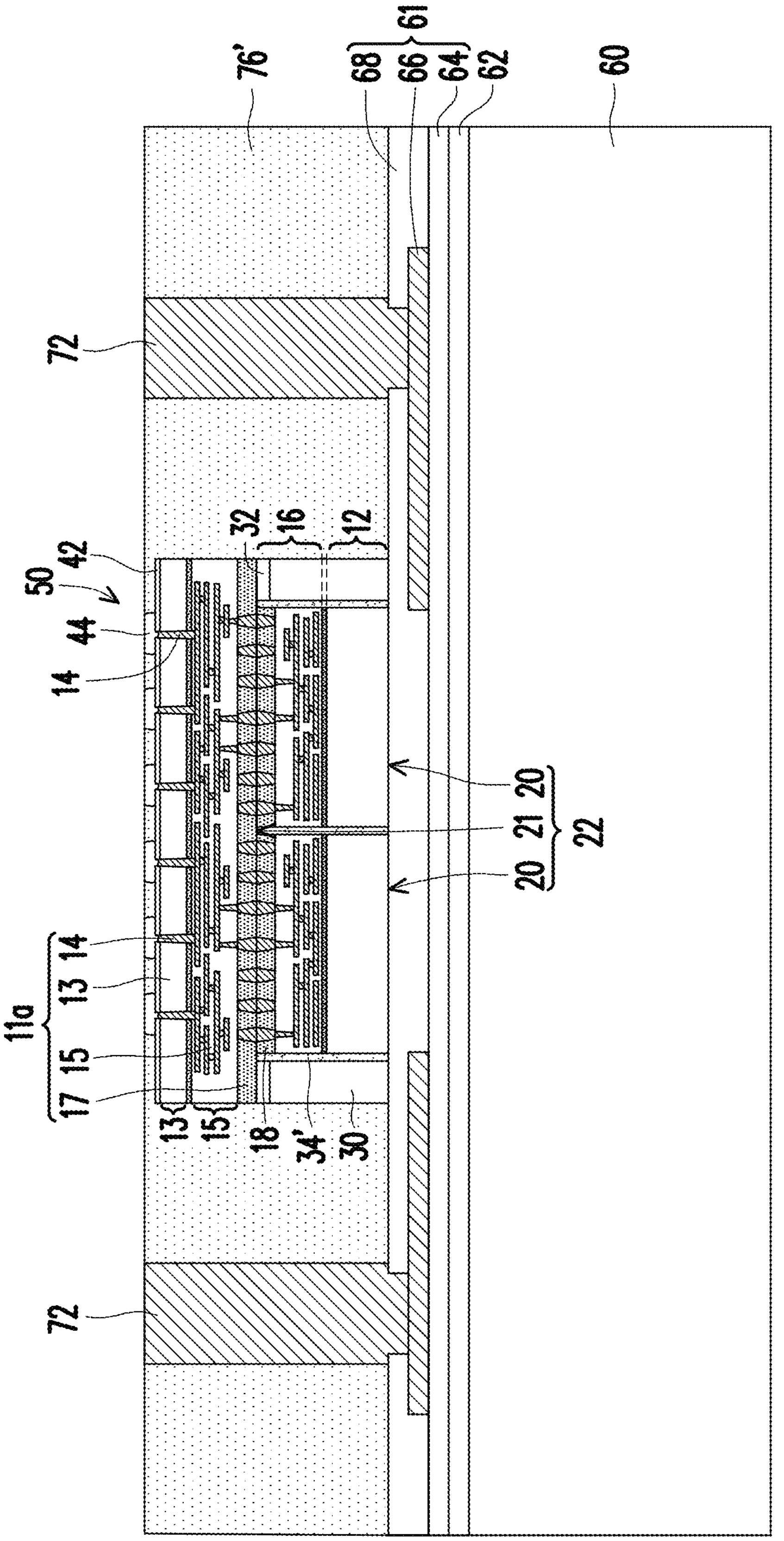

Next, as shown in FIG. 2G, a planarization process, such as a Chemical Mechanical Polish (CMP) process and/or a mechanical grinding process, is performed to partially remove the insulating encapsulation material 76 until the conductive through-vias 72 and the conductive terminals 44 are revealed. After the insulating encapsulation material 76 is thinned down, an insulating encapsulant 76' is formed to laterally encapsulate the SoIC structure 50 and the conductive through vias 72. Due to the planarization, the top ends of conductive through-vias 72 are substantially level or coplanar with the revealed surfaces of the conductive terminals 44 and the top surface of the insulating encapsulant 76', within process variations. In the illustrated exemplary embodiments, the planarization is performed until the conductive through-vias 72 and the conductive terminals 44 are revealed. Furthermore, the insulating encapsulant 76' may fill the gaps between the conductive terminals 44. Furthermore, the insulating encapsulant 76' is in contact with the patterned dielectric layer 42.

Figure 2H:
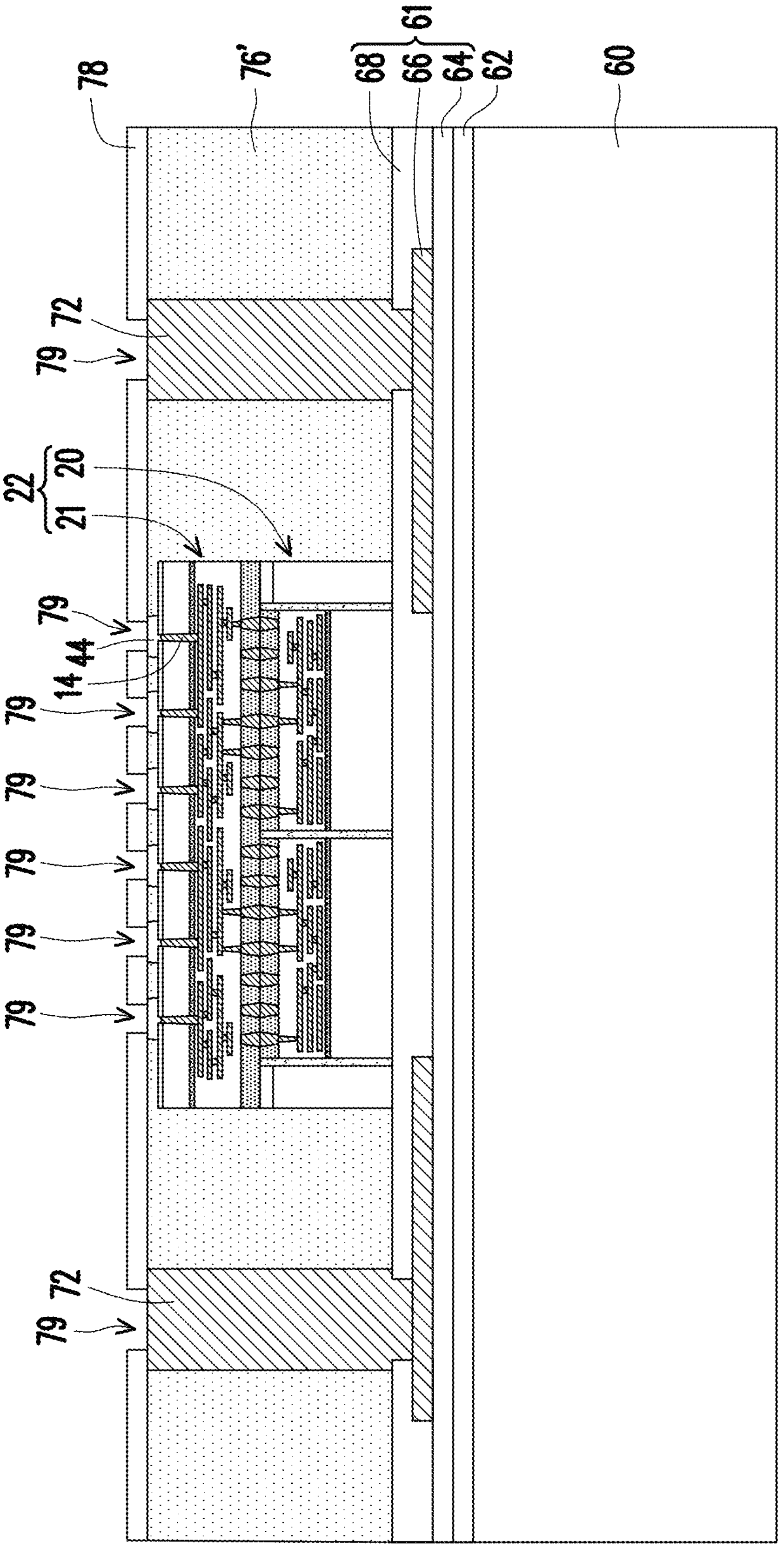
Figure 2I:
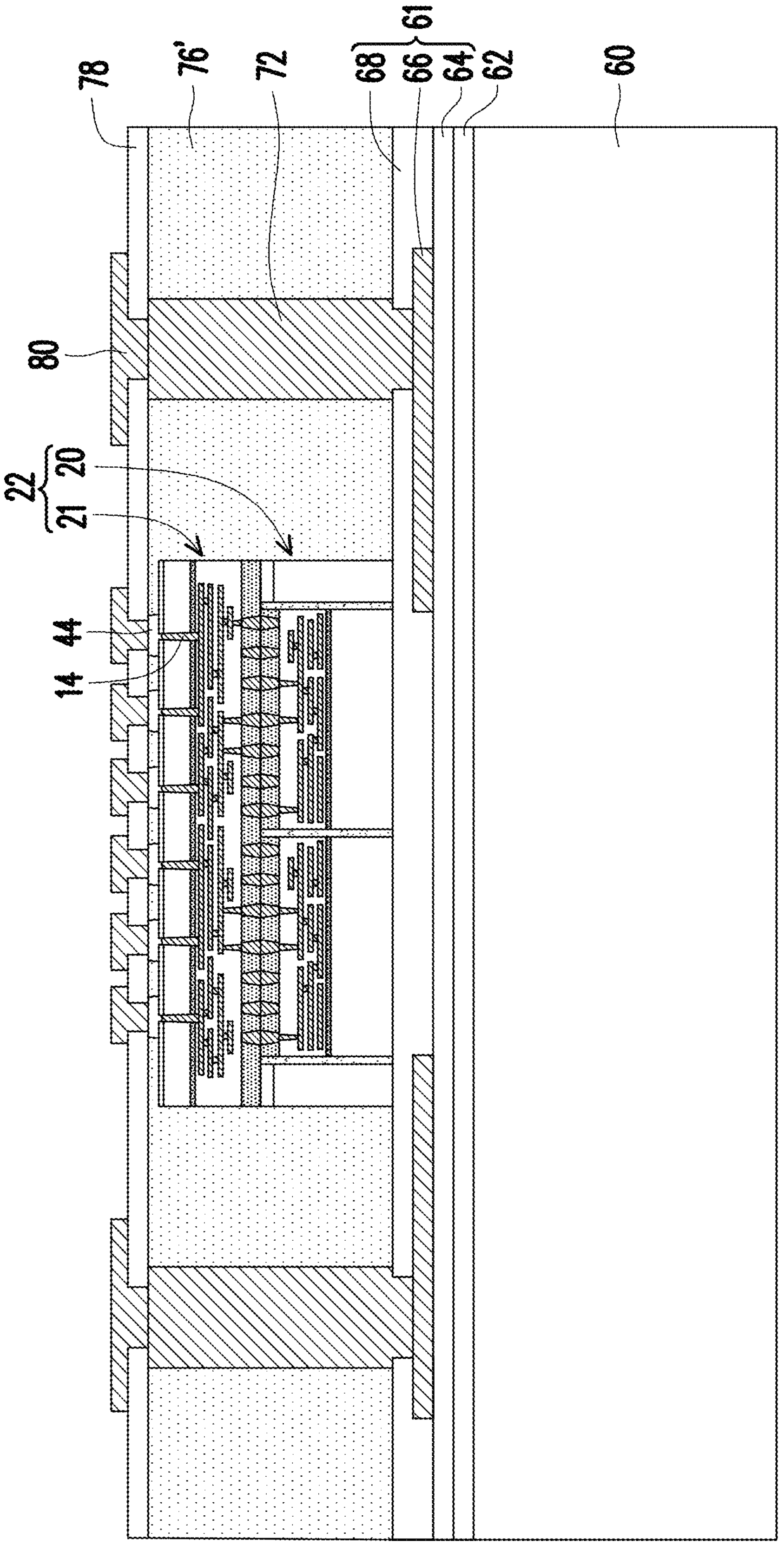
Figure 2J:
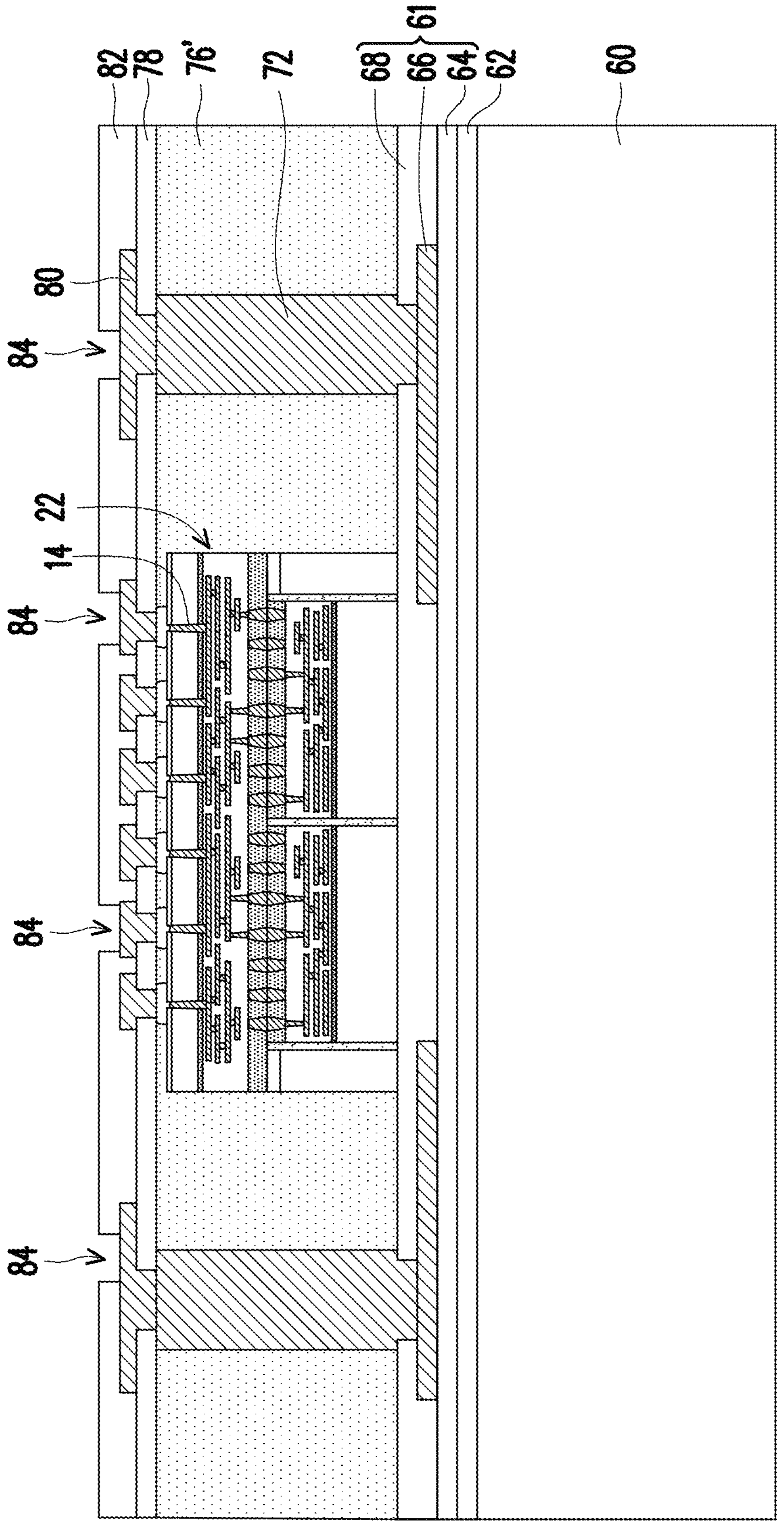
Figure 2K:
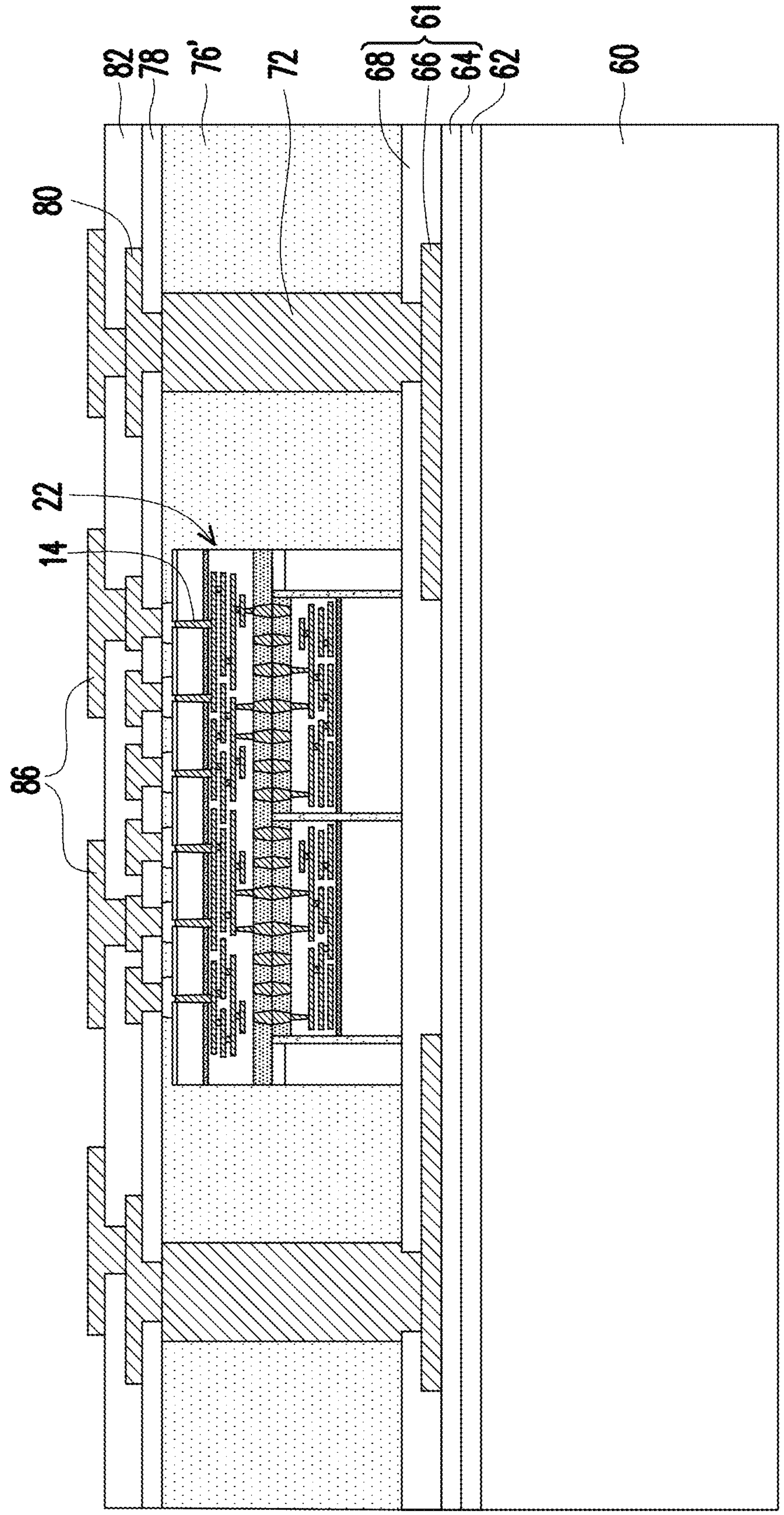
Figure 2L:
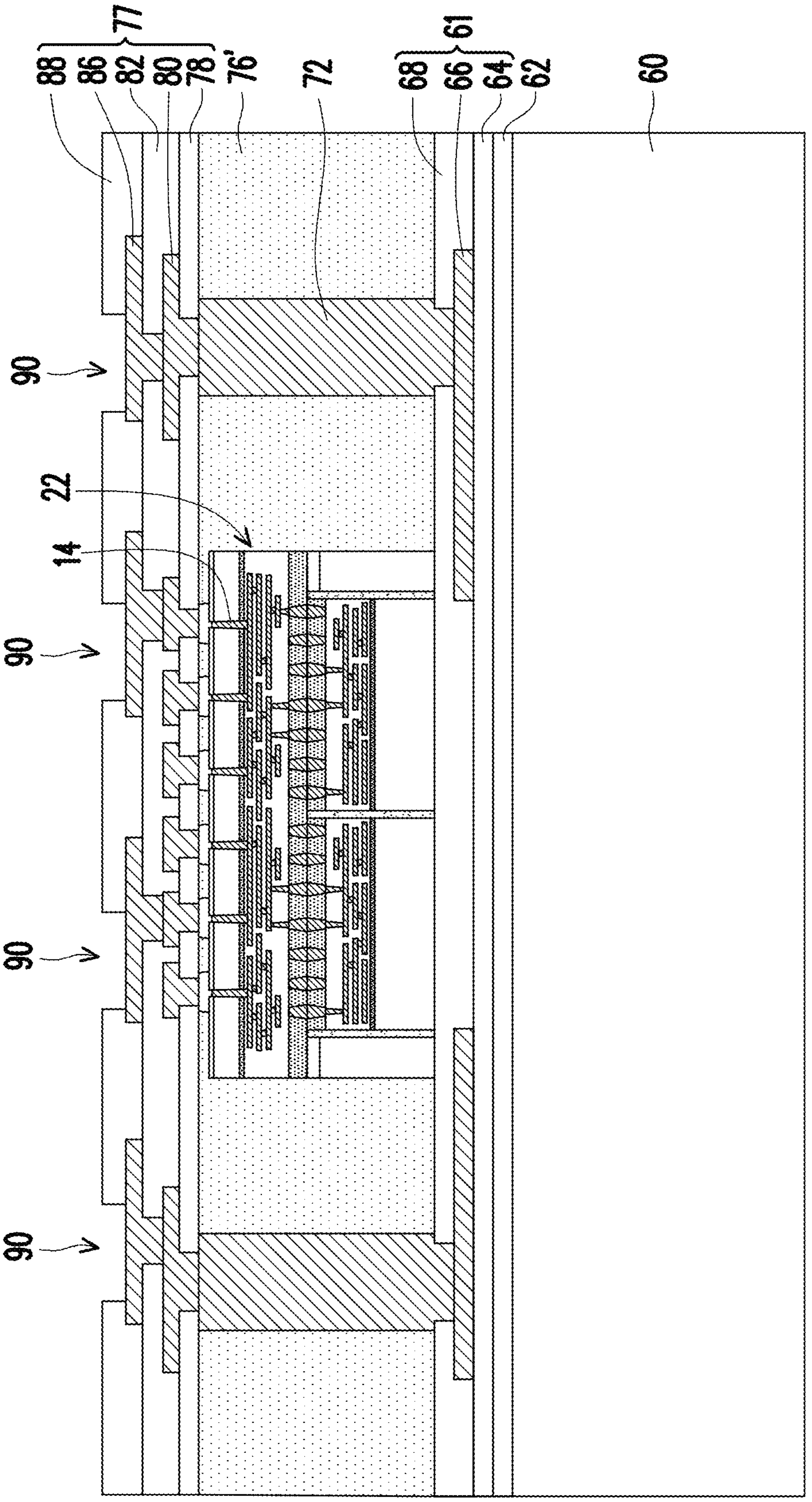
Figure 2M:
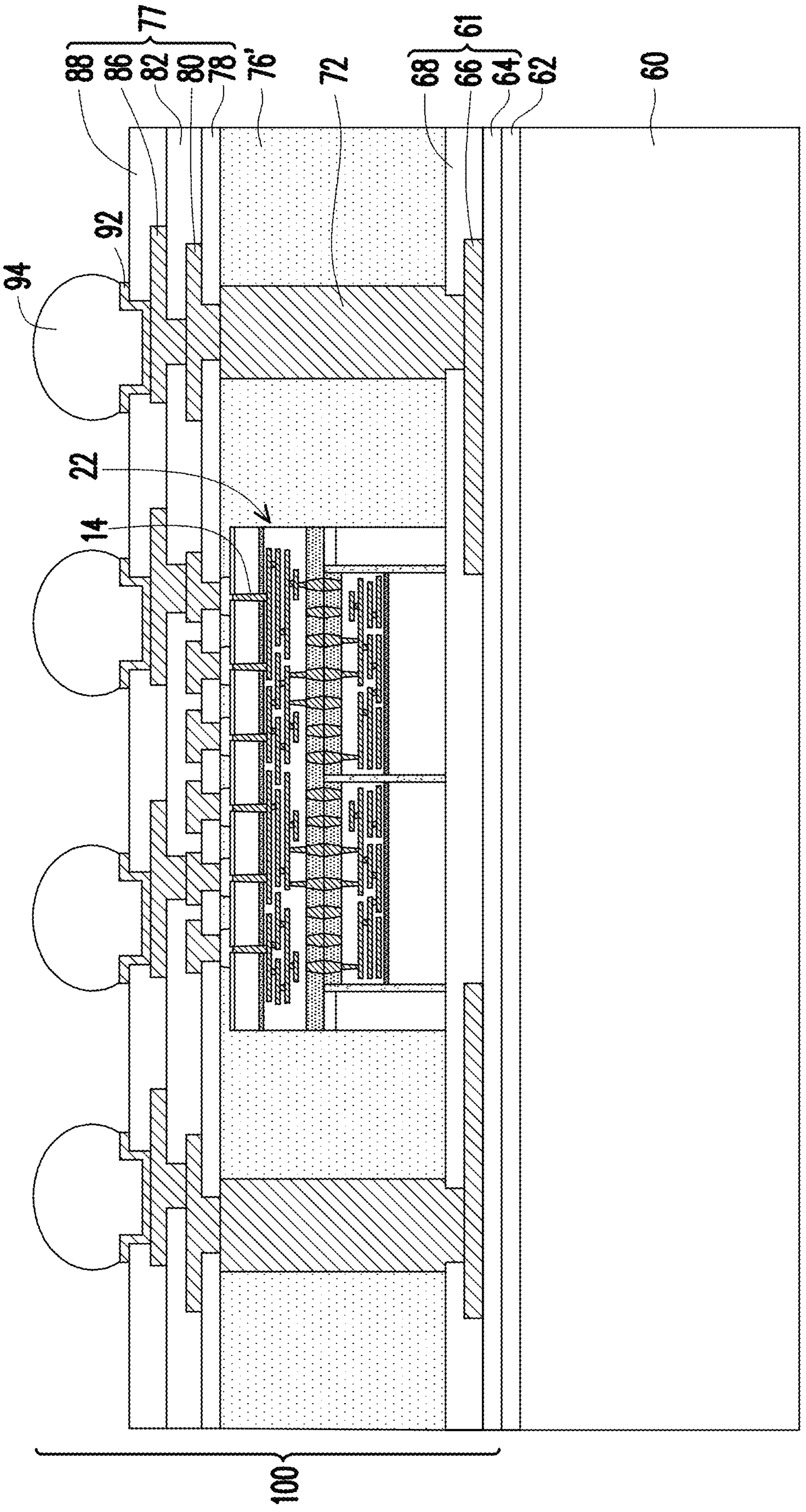

FIG. 2H through FIG. 2M illustrate formation of a redistribution circuit structure 77 and solder regions. As shown in FIG. 2H through FIG. 2L, a redistribution circuit structure 77 including a dielectric layer 78, redistribution wirings 80, a dielectric layer 82, redistribution wirings 86, and a dielectric layer 88 is formed on the substrates 12 and the insulating encapsulant 76'. As shown in FIG. 2M, solder regions including Under-Bump Metallurgies (UBMs) 92 and electrical connectors 94 disposed on the UBMs 92 are formed on the redistribution circuit structure 77.

Referring to FIG. 2H, a dielectric layer 78 is formed on the top tier semiconductor dies 20 of the SoIC structure 50 and the insulating encapsulant 76'. In some embodiments, the dielectric layer 78 is formed of a polymer such as PBO, polyimide, or the like. In some embodiments, dielectric layer 78 is formed of silicon nitride, silicon oxide, or the like. The openings 79 are formed in the dielectric layer 78 to expose the conductive terminals 44 and the conductive through-vias 72. The formation of the openings 79 may be performed through a photolithography process.

Next, referring to FIG. 2I, redistribution wirings 80 are formed to connect to the conductive terminals 44 and the conductive through-vias 72. The redistribution wirings 80 may include metal traces (metal lines) over the dielectric layer 78 as well as metal vias extending into the openings 79 (shown in FIG. 2H) to electrically connect to the conductive through-vias 72 and the conductive terminals 44. In some embodiments, the redistribution wirings 80 are formed in a plating process, wherein each of the redistribution wirings 80 includes a seed layer (not shown) and a plated metallic material over the seed layer. The seed layer and the plated material may be formed of the same material or different materials. The redistribution wirings 80 may comprise a metal or a metal alloy including aluminum, copper, tungsten, and alloys thereof. The redistribution wirings 80 are formed of non-solder materials. The via portions of the redistribution wirings 80 may be in physical contact with the top surfaces of the conductive terminals 44.

Referring to FIG. 2J, a dielectric layer 82 is formed over the redistribution wirings 80 and the dielectric layer 78. The dielectric layer 82 may be formed using a polymer, which may be selected from the same candidate materials as those of the dielectric layer 78. For example, the dielectric layer 82 may include PBO, polyimide, BCB, or the like. In some embodiments, the dielectric layer 82 may include non-organic dielectric materials such as silicon oxide, silicon nitride, silicon carbide, silicon oxynitride, or the like. The openings 84 are also formed in the dielectric layer 82 to expose the redistribution wirings 80. The formation of the openings 84 may be performed through a photolithography process.

Referring to FIG. 2K, FIG. 2K illustrates the formation of redistribution wirings 86, which are electrically connected to the redistribution wirings 80. The formation of the redistribution wirings 86 may adopt similar methods and materials to those for forming the redistribution wirings 80.

Referring to FIG. 2L, an additional dielectric layer 88, which may be a polymer layer, is formed to cover the redistribution wirings 86 and the dielectric layer 82. The dielectric layer 88 may be selected from the same candidate polymers used for forming the dielectric layers 78 and 82. Opening(s) 90 are then formed in the dielectric layer 88 to expose the metal pad portions of redistribution wirings 86. The formation of the openings 90 may be performed through a photolithography process.

FIG. 2M illustrates the formation of the UBMs 92 and the electrical connectors 94 in accordance with some exemplary embodiments. Referring to FIG. 2M, the formation of the UBMs 92 may include deposition and patterning. The formation of the electrical connectors 94 may include placing solder on the exposed portions of the UBMs 92 and then reflowing the solder to form solder balls. In some embodiments, the formation of the electrical connectors 94 includes performing a plating step to form solder regions over redistribution wirings 86 and then reflowing the solder regions. The electrical connectors 94 may also include metal pillars or metal pillars and solder caps, which may also be formed through plating. Throughout the description, the combined structure including the SoIC structure 50, the conductive through-vias 72, the insulating encapsulant 76', the redistribution circuit structures 61 and the redistribution circuit structures 77 is referred to as a package 100, which may be a composite wafer with a round top-view shape.

Next, the package 100 is de-bonded from carrier 60. The de-bonding layer 62 is also cleaned from the package 100. The de-bonding may be performed by irradiating a light such as UV light or laser on the de-bonding layer 62 to decompose the de-bonding layer 62. In the de-bonding process, a tape (not shown) may be adhered onto the dielectric layer 88 and the electrical connectors 94. In subsequent steps, the carrier 60 and the de-bonding layer 62 are removed from the package 100. A die saw process is performed to saw the package 100 into multiple Integrated Fan-out (InFO) package packages, each including at least one SoIC structure 50, conductive through-vias 72, an insulating encapsulant 76', a redistribution circuit structures 61, and a redistribution circuit structures 77. One of the resulting packages is shown as a package structure 100 illustrated in FIG. 2N.

FIG. 2N illustrates a package on package (PoP) structure in accordance with some embodiments of the present disclosure. Referring to FIG. 2N, another package 200 is provided and bonded with the package 102 such that a PoP structure is formed. In some embodiments of the present disclosure, the bonding between the package 200 and the package 102 is performed through solder regions 98, which joins the metal pad portions of the redistribution wirings 66 to the metal pads in the package 200. In some embodiments, the package 200 includes device dies 202, which may be memory dies such as Static Random Access Memory (SRAM) dies, Dynamic Random Access Memory (DRAM) dies, or the like. The memory dies may also be bonded to package substrate 204 in some exemplary embodiments.

In accordance with some embodiments of the disclosure, an SoIC structure including a first semiconductor die, second semiconductor dies, dummy dies, and a gap filling layer is provided. The second semiconductor dies are disposed over and electrically connected to the first semiconductor die. The dummy dies are disposed over the first semiconductor die to laterally surround the second semiconductor dies. The gap filling layer is disposed on the first semiconductor die to laterally encapsulate the dummy dies and the second semiconductor dies. In some embodiments, the first semiconductor die includes a first bonding structure, each of the second semiconductor dies includes a second bonding structure, and the second bonding structure of each of the second semiconductor dies is in contact with and electrically connected to the first bonding structure. In some embodiments, each of the dummy dies includes an outer sidewall, and the outer sidewall of each of the dummy dies is substantially aligned with a sidewall of the first bonding structure. In some embodiments, the dummy dies are spaced apart from the second bonding structure of each of the second semiconductor dies by the gap filling layer. In some embodiments, each of the dummy dies is laterally spaced apart from one of the second semiconductor dies by the gap filling layer. In some embodiments, each of the dummy dies includes an outer sidewall, and the outer sidewall is substantially aligned with a sidewall of the first semiconductor die. In some embodiments, two neighboring second semiconductor dies among the second semiconductor dies are laterally spaced apart from each other by the gap filling layer. In some embodiments, two neighboring dummy dies among the dummy dies are laterally spaced apart from each other by the gap filling layer. In some embodiments, the structure further includes die attachment films, wherein each of the dummy dies is attached onto the first semiconductor die through one of the die attachment films respectively.

In accordance with some other embodiments of the disclosure, an SoIC structure including a first semiconductor die, second semiconductor dies, dummy dies, and a gap filling layer is provided. The second semiconductor dies are stacked over the first semiconductor die. The dummy dies are stacked over the first semiconductor die. The gap filling layer is disposed on the first semiconductor die to laterally encapsulate the dummy dies and the second semiconductor dies, wherein each of the dummy dies includes an outer sidewall, and the outer sidewall of each of the dummy dies is substantially aligned with a sidewall of the gap filling layer. In some embodiments, the dummy dies are electrically floated. In some embodiments, the dummy dies are electrically insulated from the first semiconductor die and the second semiconductor dies. In some embodiments, the dummy dies are electrically insulted from each other. In some embodiments, a first coefficient of thermal expansion (CTE) mismatch between the gap filling layer and the first semiconductor die is greater than a second CTE mismatch between the dummy dies and the first semiconductor die. In some embodiments, a first coefficient of thermal expansion (CTE) of the gap filling layer is greater than a second CTE of the dummy dies or the second semiconductor dies.

In accordance with some other embodiments of the disclosure, an SoIC structure including a bottom tier semiconductor die, top tier semiconductor dies, a group of warpage control components, and a gap filling layer is provided. The top tier semiconductor dies are disposed over the bottom tier semiconductor die. The group of warpage control components are disposed over the bottom tier semiconductor die. The gap filling layer is disposed on the bottom tier semiconductor die and laterally encapsulating the group of warpage control components and the top tier semiconductor dies, wherein a first coefficient of thermal expansion (CTE) of the gap filling layer is greater than a second CTE of the group of warpage control components and/or the top tier semiconductor dies. In some embodiments, each one warpage control component among the group of warpage control components includes an outer sidewall, and the outer sidewall of each one warpage control component among the group of warpage control components is substantially aligned with a sidewall of the gap filling layer. In some embodiments, each one warpage control component among the group of warpage control components includes an outer sidewall, and the outer sidewall of each one warpage control component among the group of warpage control components is substantially aligned with a sidewall of the bottom tier semiconductor die. In some embodiments, each one warpage control component among the group of warpage control components is laterally spaced apart from one of the top tier semiconductor dies by a lateral distance ranging from about 30 micrometers to about 50 micrometers. In some embodiments, the group of warpage control components are electrically floated.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:

a first semiconductor die;

second semiconductor dies disposed over and electrically connected to the first semiconductor die;

dummy dies disposed over the first semiconductor die to laterally surround the second semiconductor dies, wherein a roughness of bottom surfaces of the dummy dies is smaller than a roughness of top surfaces of the dummy dies, and wherein a roughness of outer sidewalls of the dummy dies is greater than the roughness of the top surfaces of the dummy dies; and a gap filling layer disposed on the first semiconductor die to laterally encapsulate the dummy dies and the second semiconductor dies.

2. The structure of claim 1, wherein the first semiconductor die comprises a first bonding structure, each of the second semiconductor dies comprises a second bonding structure, and the second bonding structure of each of the second semiconductor dies is in contact with and electrically connected to the first bonding structure.

3. The structure of claim 2, wherein the outer sidewalls of the dummy dies are substantially aligned with a sidewall of the first bonding structure.

4. The structure of claim 2, wherein the dummy dies are spaced apart from the second bonding structure of each of the second semiconductor dies by the gap filling layer.

5. The structure of claim 1, wherein each of the dummy dies is laterally spaced apart from one of the second semiconductor dies by the gap filling layer.

6. The structure of claim 1, wherein the outer sidewalls of the dummy dies are substantially aligned with a sidewall of the first semiconductor die.

7. The structure of claim 1, wherein two neighboring second semiconductor dies among the second semiconductor dies are laterally spaced apart from each other by the gap filling layer.

8. The structure of claim 1, wherein two neighboring dummy dies among the dummy dies are laterally spaced apart from each other by the gap filling layer.

9. The structure of claim 1 further comprising die attachment films, wherein each of the dummy dies is attached onto the first semiconductor die through one of the die attachment films respectively.

10. A structure, comprising:

a first semiconductor die;

second semiconductor dies stacked over the first semiconductor die;

dummy dies stacked over the first semiconductor die; and a gap filling layer disposed on the first semiconductor die to laterally encapsulate the dummy dies and the second semiconductor dies, wherein a first roughness of outer sidewalls of the dummy dies is greater than a second roughness of the top surfaces of the dummy dies.

11. The structure of claim 10, wherein the dummy dies are electrically floated.

12. The structure of claim 10, wherein the dummy dies are electrically insulated from the first semiconductor die and the second semiconductor dies.

13. The structure of claim 10, wherein the dummy dies are electrically insulated from each other.

14. The structure of claim 10, wherein a first coefficient of thermal expansion (CTE) mismatch between the gap filling layer and the first semiconductor die is greater than a second CTE mismatch between the dummy dies and the first semiconductor die.

15. The structure of claim 10, wherein a first coefficient of thermal expansion (CTE) of the gap filling layer is greater than a second CTE of the dummy dies or the second semiconductor dies.

16. A structure, comprising:

a bottom tier semiconductor die;

top tier semiconductor dies disposed over the bottom tier semiconductor die;

a group of warpage control components disposed over the bottom tier semiconductor die; and a gap filling layer disposed on the bottom tier semiconductor die and laterally encapsulating the group of warpage control components and the top tier semiconductor dies, wherein a roughness of outer sidewalls of the gap filling layer is greater than the a roughness of a top surface of the gap filling layer.

17. The structure of claim 16, wherein a roughness of outer sidewalls of the group of warpage control components is greater than a roughness of the bottom surfaces of the group of warpage control components.

18. The structure of claim 16, wherein a roughness of outer sidewalls of the group of warpage control components is greater than a roughness of the top surfaces of the group of warpage control components.

19. The structure of claim 16, wherein the group of warpage control components are laterally spaced apart from one of the top tier semiconductor dies by a lateral distance ranging from about 30 micrometers to about 50 micrometers.

20. The structure of claim 16, wherein the group of warpage control components are electrically floated.

* * * * *